(12) United States Patent
Shih et al.

(10) Patent No.: US 7,772,591 B1
(45) Date of Patent: Aug. 10, 2010

(54) ELECTRICALLY-PROGRAMMABLE TRANSISTOR ANTIFUSES

(75) Inventors: Chih-Ching Shih, Pleasanton, CA (US); Cheng H. Huang, Cupertino, CA (US); Hugh Sung-Ki O, Fremont, CA (US); Yow-Juang (Bill) Liu, San Jose, CA (US)

(73) Assignee: Altera Corporation, San Jose, CA (US)

( * ) Notice: Subject to any disclaimer, the term of this patent is extended or adjusted under 35 U.S.C. 154(b) by 594 days.

(21) Appl. No.: 11/595,329

(22) Filed: Nov. 10, 2006

Related U.S. Application Data

(62) Division of application No. 10/780,427, filed on Feb. 17, 2004, now Pat. No. 7,157,782.

(51) Int. Cl.
*H01L 31/036* (2006.01)

(52) U.S. Cl. ........... 257/50; 257/530; 257/E23.147; 365/104; 365/189.16

(58) Field of Classification Search ............ 257/50, 257/E23.147, 530; 365/96, 189.16
See application file for complete search history.

(56) References Cited

U.S. PATENT DOCUMENTS

| | | | |
|---|---|---|---|
| 4,207,556 A | 6/1980 | Sugiyama et al. | |
| 4,433,331 A | 2/1984 | Kollaritsch | |
| 4,507,757 A * | 3/1985 | McElroy | 365/104 |
| 4,562,639 A * | 1/1986 | McElroy | 438/281 |
| 4,609,986 A | 9/1986 | Hartmann et al. | |
| 4,617,479 A | 10/1986 | Hartmann et al. | |
| 4,642,487 A | 2/1987 | Carter | |
| 4,761,768 A | 8/1988 | Turner et al. | |
| 5,070,384 A | 12/1991 | McCollum et al. | |
| 5,163,180 A * | 11/1992 | Eltoukhy et al. | 257/530 |
| 5,291,434 A | 3/1994 | Kowalski | |
| 5,303,199 A | 4/1994 | Ishihara et al. | |
| 5,324,681 A | 6/1994 | Lowrey et al. | |
| 5,374,832 A | 12/1994 | Tung et al. | |
| 5,463,244 A | 10/1995 | De Araujo et al. | |
| 5,510,730 A | 4/1996 | El Gamal et al. | |

(Continued)

OTHER PUBLICATIONS

Wei Zhang et al., "Energy Effect of the Laser-Induced Vertical Metallic Link", IEEE Transactions on Semiconductor Manufacturing, vol. 14, No. 2, May 2001 pp. 163-169.

(Continued)

*Primary Examiner*—A. Sefer
*Assistant Examiner*—Allen L Parker
(74) *Attorney, Agent, or Firm*—Treyz Law Group; G. Victor Treyz

(57) ABSTRACT

Integrated circuit antifuse circuitry is provided. A metal-oxide-semiconductor (MOS) transistor serves as an electrically-programmable antifuse. The antifuse transistor has source, drain, gate, and substrate terminals. The gate has an associated gate oxide. In its unprogrammed state, the gate oxide is intact and the antifuse has a relatively high resistance. During programming, the gate oxide breaks down, so in its programmed state the antifuse transistor has a relatively low resistance. The antifuse transistor can be programmed by injecting hot carriers into the substrate of the device in the vicinity of the drain. Because there are more hot carriers at the drain than at the substrate, the gate oxide is stressed asymmetrically, which enhances programming efficiency. Feedback can be used to assist in turning the antifuse transistor on to inject the hot carriers.

9 Claims, 15 Drawing Sheets

U.S. PATENT DOCUMENTS

| | | | |
|---|---|---|---|
| 5,831,923 | A | 11/1998 | Casper |
| 5,844,298 | A | 12/1998 | Smith et al. |
| 6,087,707 | A | 7/2000 | Lee et al. |
| 6,108,261 | A | 8/2000 | Kim et al. |
| 6,125,069 | A | 9/2000 | Aoki |
| 6,130,469 | A | 10/2000 | Bracchitta et al. |
| 6,456,546 | B2 | 9/2002 | Kim et al. |
| 6,477,094 | B2 | 11/2002 | Kim et al. |
| 6,897,543 | B1 | 5/2005 | Huang et al. |
| 2001/0050407 | A1 | 12/2001 | Gelsomini et al. |
| 2002/0050625 | A1 | 5/2002 | Cutter et al. |
| 2003/0169095 | A1 | 9/2003 | Kothandaraman |
| 2004/0065941 | A1 | 4/2004 | Marr |
| 2004/0100849 | A1* | 5/2004 | Novosel et al. .......... 365/225.7 |
| 2004/0114433 | A1* | 6/2004 | Forbes .................. 365/185.18 |

OTHER PUBLICATIONS

"Analyzing the process window for laser copper-link processing" Solid State Technology—Semiconductor manufacturing and wafer fabrication, Jan. 8, 2003.

Alexander Kalnitsky et al. "CoSi2 integrated fuses on poly silicon for low voltage 0.18 um CMOS applications" (c) 1999 IEEE.

Mohsen Alavi "A PROM Element Based on Salicide Agglomeration of Poly Fuses in a CMOS logic process" IEEE International Electron Devices Meeting, Dec. 1997.

Noriaki Sato et al. "A New Programmable Cell Utilizing Insulator Breakdown", IEDM 1985, pp. 639-642.

Jinbong Kim et al. "Three-Transistor One-Time Programmable (OTP) ROM Cell Aray Using Standard CMOS Gate Oxide Antifuse", IEEE-Electron Device Letters, vol. 24, No. 9, Sep. 2003, pp. 589-591.

Wei Zhang et al. "Laser-Formed Vertical Metallic Link and Potential Implementation in Digital Logic Integration", PROC MAPLD, MD, 1999 pp. 1-7 (B5).

V. Klee et al. "A 0.13 um logic-based embedded DRAM technology with electrical fuses, Cu interconnect in SiLK, sub-7ns random access time and its extension to the 0.10 um generation," IEEE (c) 2001 IEDM (International Electron Devices Meeting), Technical Digest, pp. 18.5.1-18.5.4.

M. Depas et al. "Soft Breakdown of Ultra-Thin Gate Oxide Layers" IEEE Transactions on Electron Devices IEEE (c) 1996, vol. 43, No. 9, Sep. 1996 pp. 1499-1504.

Wei Zhang et al., "Reliability of laser-induced metallic vertical links," IEEE Trans. on Advanced Packaging, pp. 619-619 Nov. 1999 vol. 22 Issue 4.

JB Bernstein et al. "Analysis of laser metal-cut energy process window" IEEE Trans. on Semicond. Manuf., pp. 228-234, May 2000, vol. 13, Issue 2.

JB Bernstein et al. "Layer energy limitation for buried metal cuts" IEEE Electron Device Letters, pp. 4-6, Jan. 1998, vol. 19, Issue 1.

RT Smith et al. "Laser programmable redundancy and yield improvement in a 64 K DRAM", IEEE Journal of Solid-State Circuits, pp. 506-514 Oct. 1981, vol. 16, Issue 5.

\* cited by examiner

US 7,772,591 B1

ELECTRICALLY-PROGRAMMABLE TRANSISTOR ANTIFUSES

This application is a division of patent application Ser. No. 10/780,427, filed Feb. 17, 2004, now U.S. Pat. No. 7,157,782 which is hereby incorporated by reference herein in its entirety.

BACKGROUND OF THE INVENTION

This invention relates to antifuses, and more particularly, to electrically-programmable integrated circuit antifuses and methods for programming antifuses and sensing their states.

Programmable fuses and antifuses are used in a variety of integrated circuit applications. For example, a programmable logic device may have logic that is customized by programming appropriate fuses or antifuses on the device. Fuses and antifuses may also be used to permanently switch redundant circuitry into place to fix reparable defects during the integrated circuit manufacturing process. Sometimes it may be desired to use fuses or antifuses to program a serial number or other special information into a circuit.

Fuses and antifuses may be programmed using special laser-based systems or may programmed electrically.

With laser programming, each fuse or antifuse must be programmed in series, so the programming process can be lengthy. The programming equipment used in laser-based systems may also be complex and expensive.

Electrically programmable fuses and antifuses are attractive because the need for laser-based programming equipment is eliminated and programming speeds can generally be increased. Such a fuse or antifuse should have a high ratio of programmed to unprogrammed resistance and should be capable of being programmed with low power in a short amount of time. For applications in which it is desired to keep the state of the fuses or antifuses secret after programming, such as when fuses or antifuses are used to store cryptographic information, it should be difficult or impossible to use diagnostic tools such as scanning electron microscopes to determine whether a given fuse or antifuse has been programmed.

It is an object of the present invention to provide improved programmable integrated circuit antifuses whose state is difficult to ascertain by reverse engineering.

SUMMARY OF THE INVENTION

Integrated circuit transistor antifuses are provided. Circuitry and methods for programming the antifuses and sensing their states are also provided.

The antifuses may be based on metal-insulator-semiconductor transistor structures that are programmed by breaking down a gate insulator. The transistor structures may be metal-oxide-semiconductor (MOS) structures having gate insulators formed from an oxide such as silicon oxide. The state of the gate oxide (i.e., whether the gate oxide is intact or has been blown) is difficult to detect using reverse engineering tools such as scanning electron microscopes. This allows the antifuses to be used in applications that require the states of the antifuses to be kept secret.

The gate oxide can be broken down using localized hot carriers. During programming of an antifuse, the MOS transistor structure in the antifuse is biased so that hot carriers are generated adjacent to a particular portion of the gate oxide. This breaks down the gate oxide in this localized area and programs the antifuse so that it conducts current. Because the break-down effect is localized, the programming power and time required to program the antifuse can be minimized.

The antifuse transistor structure has source, drain, gate, and substrate terminals. To produce hot carriers at the gate to break down the gate oxide, the drain-substrate junction is reversed biased. This places the drain-substrate junction in avalanche breakdown and causes an avalanche breakdown current to flow. The avalanche breakdown current of the drain-substrate junction is enhanced by injecting carriers into the substrate by forward-biasing the substrate-source junction.

Further features of the invention, its nature and various advantages will be more apparent from the accompanying drawings and the following detailed description of the preferred embodiments.

BRIEF DESCRIPTION OF THE DRAWINGS

FIG. 12b is a diagram showing the circuit symbol corresponding to the gated diode structure of FIG. 12a.

DETAILED DESCRIPTION OF THE PREFERRED EMBODIMENTS

This invention relates to antifuses based on integrated circuit transistor structures ("transistor antifuses"). The invention also relates to programming circuitry and methods for programming antifuses and sensing their states.

Programmable antifuses may be used to program (configure) portions of an integrated circuit. In their unprogrammed state, antifuses have high resistances. After programming, the antifuses become conductive. The state of an antifuse (whether programmed or unprogrammed) can be detected using sensing circuitry and used for control and data functions on the integrated circuit.

The integrated circuit containing the antifuses may be, for example, a programmable logic device that has user-customizable logic. The integrated circuit may also be a microprocessor, a digital signal processor, an application specific integrated circuit, logic, memory, a digital circuit, an analog circuit with programmable devices, a combination of such circuits or any other suitable integrated circuit.

The integrated circuit may be programmed by a manufacturer or by an intermediate or end user. For example, if a manufacturer desires to include a serial number, certain coding, or other special information in the integrated circuit, the manufacturer can program the antifuses on the integrated circuit appropriately during the manufacturing process. As another example, a manufacturer may produce integrated circuits that contain redundant circuitry. If a repairable defect is detected by the manufacturer during device testing, antifuses on the circuit may be programmed so that appropriate spare circuitry is switched into use to replace the defective circuit.

Programmable logic devices can be customized by users to perform desired logic functions. Such devices may be customized by programming antifuses appropriately. Programmable logic devices may also use antifuses to implement redundancy schemes or to store codes, serial numbers, or other special information in a non-volatile manner as with other integrated circuits.

Figure 1:
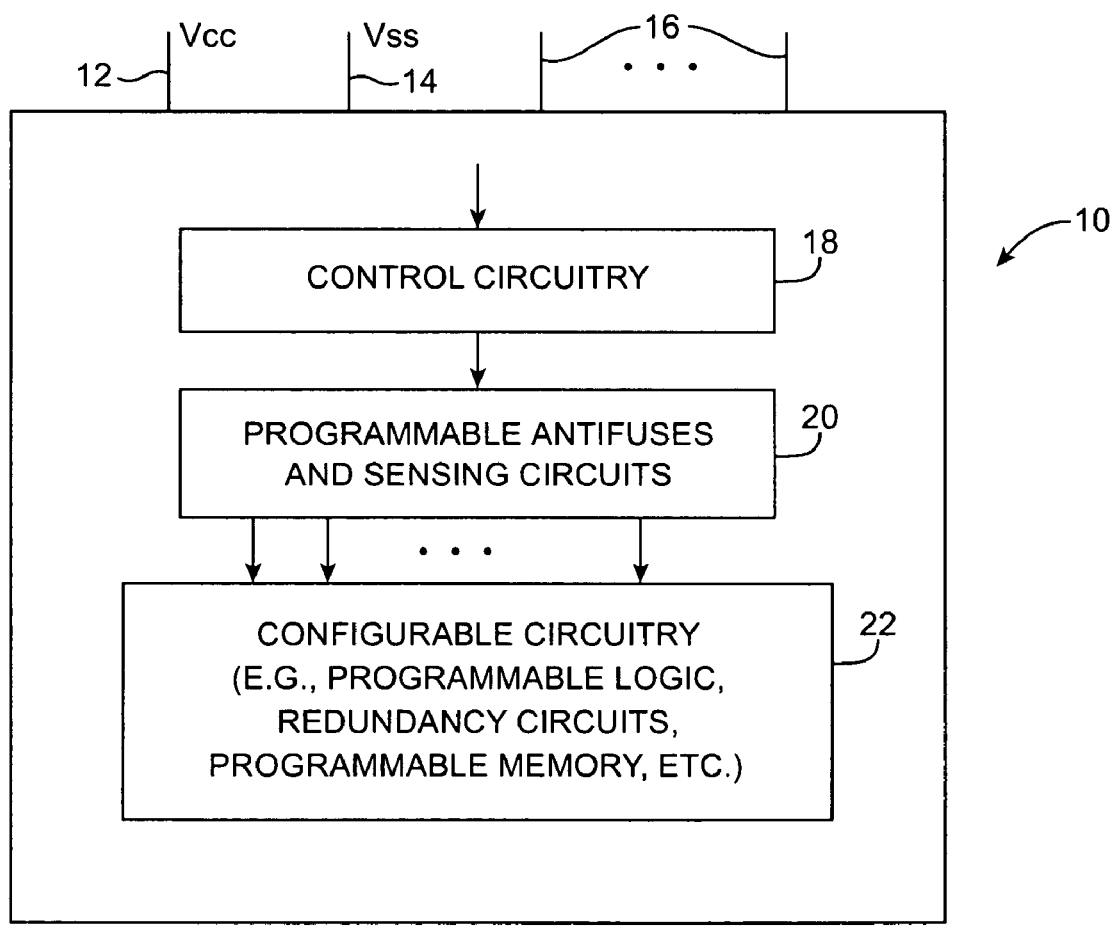
FIG. 1 is a schematic diagram of an illustrative integrated circuit having antifuses, programming circuitry for programming the antifuses, and sensing circuitry for sensing the states of the antifuses in accordance with the present invention.

An integrated circuit 10 in accordance with the present invention is shown in FIG. 1. The integrated circuit 10 may have one or more power supply terminals such as terminal 12 and terminal 14. Terminals such as terminal 12 may be used to supply a positive power supply voltage (e.g., a Vcc voltage of 1.2 volts). Terminals such as terminal 14 may be used to supply a ground potential (e.g., a Vss voltage of 0 volts). Terminals 16 may be used for I/O signals (e.g., normal data signals during device operation and programming signals during device programming operations). Terminals such as terminals 16 may also be used to provide other power supply voltages (e.g., programming voltages of about 4.5-5.5 volts, an I/O power supply voltage of about 3.3 volts, etc.). The particular voltages described herein are merely illustrative. Any other suitable voltage levels may be used if desired.

Moreover the polarities of the signals (positive and negative) and types of semiconductor (e.g., n-type and p-type silicon) that are used are merely illustrative.

Although aspects of the invention are described using n-channel metal-oxide-semiconductor (NMOS) transistors, p-channel metal-oxide-semiconductor (PMOS) transistors may be used if desired. Moreover, the insulting materials used for the gates of these devices, while typically oxide, may also be other insulating materials (e.g., nitrides, layers of both nitride and oxide, oxynitrides, or any other suitable dielectric or insulator). These transistor structures are therefore sometimes referred to as metal-insulator-semiconductor (MIS) transistors and, because oxide is a particularly suitable insulator to use, these structures are often referred to as metal-oxide-semiconductor (MOS) transistors.

The "metal" of the MIS/MOS transistor structures may be formed from a pure metal or metal alloy or other suitable conductive materials (e.g., doped polysilicon, silicide, silicided doped polysilicon, etc.). Regardless of which of these conductors is used, the transistor structures will still be referred to herein as MIS or MOS transistors.

MOS transistors have sources and drains. Because the labeling of the source and drain in a given MOS transistor structure is somewhat arbitrary (i.e., because the labeling can be reversed so that the source is labeled as the drain and vice versa), these terminals can be generically referred to as source-drain terminals. For clarity, the present invention is generally described in connection with a particular arrangement (i.e., with one source-drain terminal labeled as being the source and the other source-drain terminal being labeled as the drain in a particular way), but, if desired, the source and drain labels of the source-drain terminals could be reversed.

Moreover, although described in the context of a silicon-based arrangement, integrated circuit 10 may be based on any suitable semiconductor. For example, the substrate material from which circuit 10 is formed may be a semiconductor such as silicon (or silicon-on-insulator), silicon germanium, gallium arsenide, indium phosphide, combinations of such materials, etc. These substrate materials are typically processed while in the form of wafers and are subsequently divided into individual circuits 10 prior to packaging.

The circuitry of integrated circuit 10 is interconnected by a number of layers of circuit interconnections. These interconnect layers include patterned conductors and insulators. The conductors in the interconnects on circuit 10 serve to route signals between various devices on circuit 10. The insulators serve to electrically isolate the conductors from each other and from the devices formed in the substrate. The layers of insulators and conductors in the interconnects and the antifuse structures, active devices, and associated circuitry of circuit 10 may be formed using plasma deposition and etching, chemical vapor deposition, sputtering and evaporation, electroplating, ion-implantation and diffusion, thermal oxide growth, and other suitable semiconductor fabrication techniques.

In a typical modern integrated circuit there are about 4-9 interconnect layers and other layers of material such as polysilicon, silicides, nitride, solder bumps, and passivation layers. For clarity, only the most relevant portions of the antifuses and associated structures are shown in the FIGS. For example, insulating layers that may include multiple individual dielectric layers are generally shown as single layers of insulator. Conductors that may be based on multiple individual layers of conductive materials are generally shown as single layers of conductor.

As shown in FIG. 1, the programming signals and power supply signals from I/O terminals such as terminals 12, 14, and 16 may be provided to circuitry within the integrated circuit such as control circuitry 18. Control circuitry 18 may increase the voltage of the power supply (if desired) and may produce programming signals at appropriate voltage and current levels for antifuse programming. As an example, control circuitry 10 may increase the strength of low-level programming signals provided at I/O pins 16 so that the resulting strengthened signals may be used to program antifuses 20.

The programmable antifuses may have associated sensing circuitry. The sensing circuitry may be used to convert the resistance of an antifuse (which may be either high or low depending on the state of the antifuse) into a corresponding voltage signal (e.g., a high or low logic voltage level $V_{OUT}$). Each antifuse may have an associated sensing circuit. In the illustrative arrangements described herein, the sensing circuitry used to sense the states of the antifuses is shown together with programming circuitry used to program the antifuses. This is, however, merely illustrative. If desired, sensing circuitry functions and programming circuitry functions may be performed using other suitable arrangements.

The output voltage from each antifuse sensing circuit may be applied to a corresponding controllable device (e.g., a transistor gate or gates, one or more transistor gates in a multiplexer, switch, pass transistor, or the input or control terminal of any other suitable logic element or circuit component on circuit 10). Such configurable components are depicted generally as configurable circuitry 22 in FIG. 1. The configurable components may be configurable programmable logic (e.g., on a programmable logic device), may be part of a memory (or a circuit that serves a memory function), may be part of a switch associated with a redundancy scheme, or any other suitable circuitry that it is desired to configure.

If desired, the outputs $V_{OUT}$ of the sensing circuits may be read without using them to specifically configure any downstream logic. For example, if it is desired to program a serial number or other information or coding into the circuit 10, the appropriate bits may be programmed into circuit 10 by programming the antifuses accordingly. The output signals from the sensing circuitry associated with the antifuses will then represent the states of the programmed antifuses. If access to the information programmed into the antifuses is desired, circuitry may be used to access and read the states of the sensing circuit outputs.

The antifuses of the present invention are based on metal-oxide-semiconductor (MOS) transistor structures. A metal-oxide-semiconductor transistor may have a source terminal (typically labeled S), a drain terminal (typically labeled D), a gate terminal (typically labeled G), and a substrate terminal (typically labeled SUB). These terminals (also sometimes called electrodes) are formed using a conductive material such as copper or other metal, doped polysilicon, silicide, or combinations of such materials and associated doped semiconductor regions.

In a MOS transistor, a gate insulator is used to electrically insulate the gate electrode terminal from an underlying channel region in the semiconductor. The gate insulator is typically formed from thermally-grown silicon oxide, so the gate insulator is often referred to herein as the "gate oxide."

In antifuse structures based on MOS transistors, the gate oxide is initially intact. The gate oxide blocks current flow and creates a high resistance. During antifuse programming, the gate oxide is "blown," to form a conductive path through the gate oxide. This conductive path significantly lowers the resistance of the antifuse. An antifuse having a gate oxide that has been blown is said to be "programmed." Sensing circuitry associated with the antifuses may be used to convert the high or low resistances of the antifuses into appropriate digital signals for use by downstream circuitry on integrated circuit 10.

Figure 2:
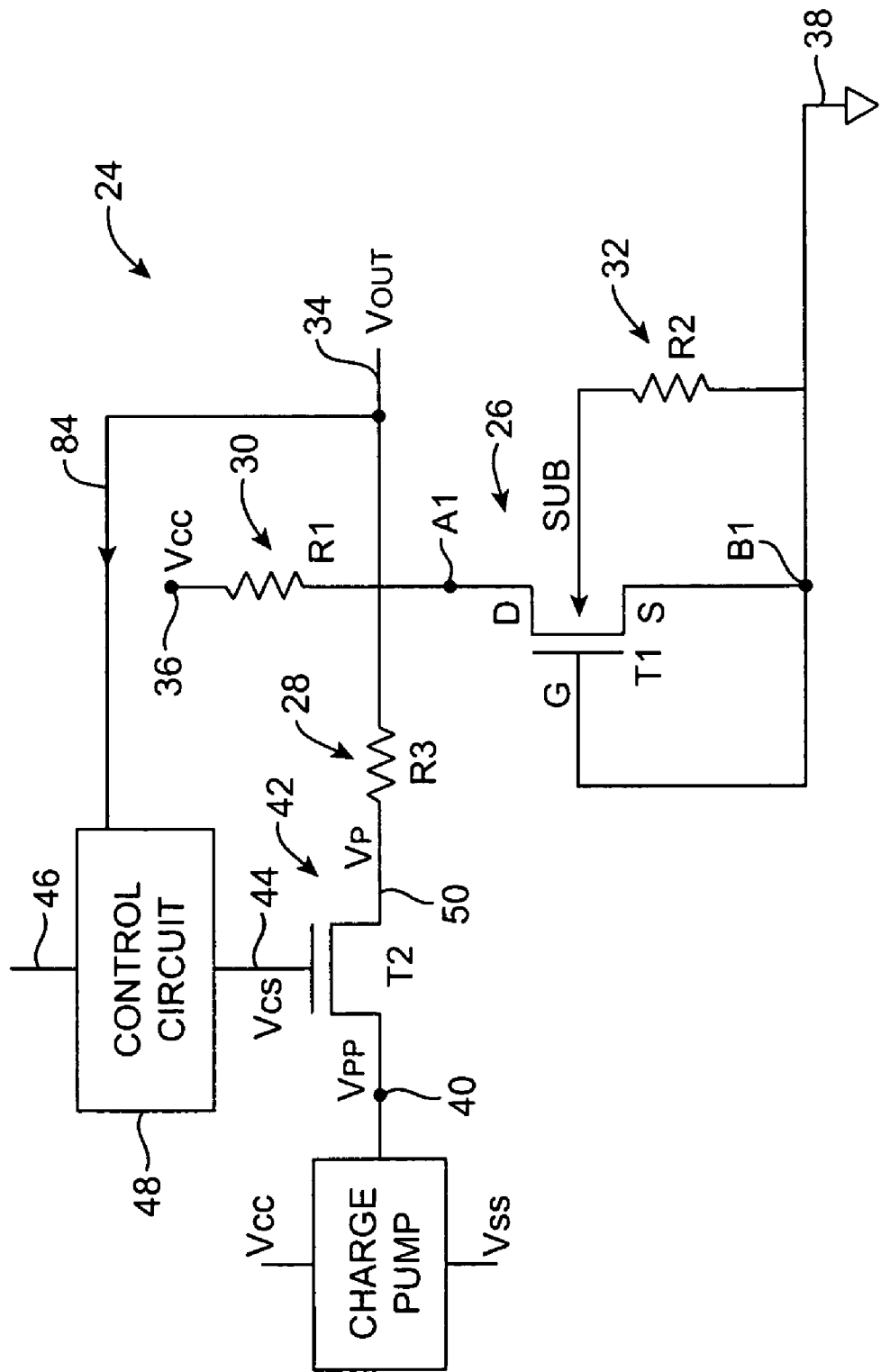
FIG. 2 is a circuit diagram of illustrative antifuse circuitry in accordance with the present invention.

An illustrative antifuse circuit 24 for an integrated circuit such as integrated circuit 10 of FIG. 1 is shown in FIG. 2. Circuit 24 includes an antifuse 26, circuitry for antifuse programming, and sensing circuitry. In the illustrative arrangement of FIG. 2, transistor T1 serves as the antifuse. In FIG. 2 and the other FIGS., transistor T1 is shown illustratively as an NMOS transistor, but a PMOS transistor may be used if desired, provided that appropriate changes are made to the connections to its gate, drain, source, and substrate terminals.

Resistors 28, 30, and 32 (having respective illustrative resistances of about 40-80 k$\Omega$, 10 M$\Omega$, and 10 M$\Omega$) serve programming and sensing functions. During sensing, resistors 30 and 32 serve to convert the programmed or unprogrammed resistance value of transistor 26 into a corresponding logic low or high signal $V_{OUT}$ at sensing circuit output terminal 34 during post-programming operation of circuit 10. During programming, resistor 28 serves as a current-limiting resistor, which helps to prevent excessive current from flowing through transistor 26.

Resistor 28 is optional, but an advantage of using resistor 28 to limit current flow is that this helps to prevent localized silicon melting in the antifuse transistor during programming. If the silicon in the antifuse were to melt during programming, it would make the antifuse's state easier to detect by reverse engineering. This could compromise security in an environment in which it is desired to maintain the states of the antifuses (programmed or unprogrammed) a secret. By using only gate oxide programming to set the states of the antifuses 26, security is enhanced considerably, because it is generally difficult or impossible to detect whether a given antifuse 26 has been programmed using the tools that are commonly available for reverse engineering (e.g., scanning electron microscopes).

A power supply voltage (e.g., a voltage Vcc of 1.2 volts) may be provided to terminal 36. A source of ground potential (e.g., a voltage Vss of 0 volts) may be applied to terminal 38. Voltages Vcc and Vss may be the same voltages that are being used by the core circuitry on integrated circuit 10. As a result, these voltage may be readily available for antifuse circuit 24.

A programming voltage Vpp may be used to program antifuse 26. With the illustrative arrangement of FIG. 2, the programming voltage Vpp is generally higher than Vcc. Such an elevated voltage Vpp may be provided using an external pin (e.g., one of pins 16 of FIG. 1) or may be generated on circuit 10 using a charge pump circuit 41 or other suitable voltage-generating circuit that creates the voltage Vpp from a lower voltage. The Vpp voltage can be generated from any suitable voltage including an I/O voltage (e.g., a 3.3 volt I/O supply voltage) that is higher than Vcc and that is used to provide power to input-output circuitry at the periphery of integrated circuit 10 of FIG. 1. The voltage Vpp may be, for example, 4.5-5.0 volts.

This voltage level is, however, merely illustrative. As device geometries change due to improvements in semiconductor fabrication technology, the programming voltages and the other signal levels and component values that are used herein will generally also change.

The programming voltage Vpp may be provided to terminal 40 of circuit 24. A programming control circuit may be used to selectively apply the programming voltage to antifuse 26. During normal operation, the programming circuit can isolate the programming voltage Vpp from the antifuse 26, so that the antifuse 26 operates normally (in either its programmed or unprogrammed state). During programming, the programming circuit can allow the programming voltage Vpp to pass through to the antifuse 26 to blow its gate oxide.

With the illustrative arrangement of FIG. 2, the programming supply voltage Vpp is used as an input to gating transistor (pass transistor) 42. The gate of transistor 42 may be controlled by appropriate control signals $V_{CS}$ supplied at gate 44. With one suitable arrangement, low-level programming signals (e.g., logic-level programming information) may be provided at terminal 46 of control circuit 48. The logic-level programming information may, for example, be provided from external electrical programming equipment that is connected to circuit 10 through one or more of pins 16 during the configuration or programming of circuit 10 at a manufacturer as part of the manufacturing process or during the programming of circuitry 10 by an intermediate user or end user.

The control circuit 48 may use the elevated programming voltage Vpp and the lower-level programming information signals at terminal 46 to create the corresponding programming control signals $V_{CS}$ that are provided to the control gate 44 of pass transistor 42. During programming, the output of pass transistor 42 (programming signal Vp) is provided to output terminal 50. A typical programming signal Vp has a magnitude of about 4.5 volts (i.e., a voltage Vpp of 5.0 volts minus the threshold voltage of the pass-gate transistor T2, which may be about 0.5 volts). The duration of the programming signal may be about 10 ms.

In the example of FIG. 2, transistor 42 is an NMOS transistor. The Vp signal can be maintained at the same level same while reducing the Vpp voltage if a PMOS-pass gate transistor is used in place of an NMOS transistor. Such a PMOS pass gate transistor can be turned on with the application of ground voltage to its gate 44.

Only a single programming pulse of about 10 ms in duration is generally required to program each antifuse bit, so programming all of the antifuses on circuit 10 is relatively rapid. Moreover, because the power required to program each antifuse is relatively low, multiple bits may be programmed in parallel by control circuitry 18 (FIG. 1).

When antifuse transistor 26 is unprogrammed (its initial state), the resistance of transistor 26 (i.e., the resistance between drain D at antifuse terminal A1 and the source S and gate G at antifuse terminal B1 in FIG. 2) is high (e.g., 100 MΩ or more). With antifuse transistor 26 in an unprogrammed state, a negligible current therefore flows through transistor 26. This low current characteristic of the antifuse helps to lower the power dissipation through the unprogrammed antifuse circuitry on circuit 10. The high unprogrammed resistance of the antifuse transistor 26 relative to the resistance of resistor R1 causes the output voltage $V_{OUT}$ to rise almost to $V_{CC}$, thereby producing a logic high signal $V_{OUT}$ at terminal 34 of the sensing circuitry.

When antifuse transistor 26 is programmed by momentarily applying a high voltage Vp across its terminals A1 and B1, the resistance of antifuse transistor 26 drops significantly (e.g., by about four or five orders of magnitude or more). The resulting low resistance of antifuse 26 pulls the voltage on terminal 34 low, so that the output voltage $V_{OUT}$ is at a logic low signal level.

As shown in FIG. 2, the source S and gate G of the antifuse transistor are electrically connected to each other at terminal B1, while only the drain is connected to terminal A1. The drain D and source S are therefore not directly electrically connected to each other. As a result, when the programming voltage is applied across the terminals A1 and B1 of the antifuse transistor 26, an asymmetry develops. The asymmetry creates hot carriers at one end of the channel. The localized hot carriers at this end of the channel break down the gate oxide more rapidly and/or at lower power than would possible if a symmetric arrangement were used to stress the gate oxide. In a symmetric arrangement, the oxide would be stressed uniformly along its length, so it would not tend to fail as readily. With the present approach, in contrast, the localization of stress on the gate oxide helps to initiate the gate oxide breakdown process. Once this process starts, current flows through the gate oxide and completes the programming process.

Figure 3:
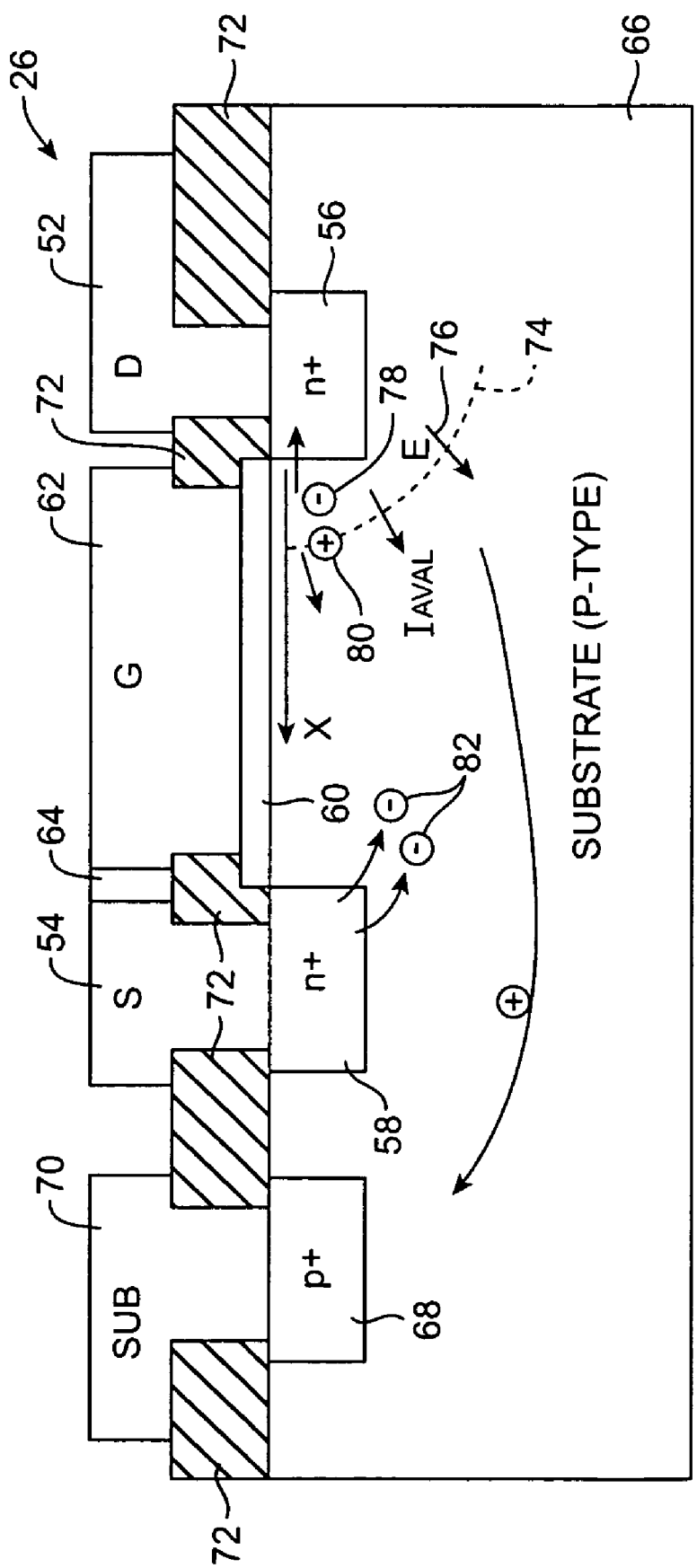
FIG. 3 is a cross-sectional side view of an illustrative antifuse in accordance with the present invention.

A cross-section of an illustrative device structure suitable for implementing the antifuse transistor 26 of FIG. 2 is shown in FIG. 3. As shown in FIG. 3, the antifuse transistor 26 has a drain contact conductor 52 (labeled drain terminal D and antifuse terminal A1 in FIG. 2). The antifuse transistor 26 also has a source conductor 54. Drain terminal 52 is connected to n+ region 56 to form the drain of n-type metal-oxide-semiconductor (NMOS) transistor 26. Source terminal 54 is connected to n+ region 58 to form the source of transistor 26. Layer 72 is an insulator.

Transistor 26 has a gate (labeled G in FIG. 2) that is formed from a thin (typically 10 s or 100 s of angstroms thick) oxide 60 (typically thermal oxide) covered by a polysilicon layer or other suitable conductor 62. A layer of silicide (e.g., cobalt silicide) may be deposited on top of the layer of polysilicon in gate electrode 62 to assist in forming a good contact for the gate. A layer of silicide may also be deposited on top of the drain n+ region 56 and the source n+ region 58 to assist in localizing the programming current. This reduces the total programming current needed for programming the antifuse transistor.

A conductor 64 lies between the gate region 62 and the source region 54. Conductor 64 electrically interconnects the gate G and source S, as shown in FIG. 2.

Resistors such as resistors R1, R2, and R3 of FIG. 2 may be formed from a layer of oxide such as the oxide layer that is referred to as the "poly-layer dielectric" in many NMOS fabrication processes and that is used to isolate poly interconnects from the substrate. A layer of shallow trench isolation (STI) may be formed under this oxide in the region of the resistors to help isolate the resistors from the substrate. The electrically active portion of the resistors may be formed from a lightly-doped (or undoped) polysilicon layer.

The antifuse transistor 26 of FIG. 3 may be formed in a p-well 66. The p-well region 66 may be a p-type substrate or a p-type region in a surrounding n-type region. This region 66 is referred to herein as the "substrate" of transistor 26. An associated terminal 70 makes an ohmic connection to region 66 via p+ tap 68 and is referred to herein as the SUB terminal. The SUB terminal 70 may be connected to one end of resistor R2 (FIG. 2) by a conductive trace. The other end of resistor R2 may be connected to $V_{SS}$ by a conductive trace. Silicide films may be deposited directly under the contacts of the resistors to provide good ohmic conduction.

The conductive regions of FIG. 3 may be electrically isolated from the other layers of antifuse structure 26 by the insulating layer 72. Layer 72 may be, for example, the insulating layer often referred to as "metal 1 dielectric" where metal 1 is the bottom layer of metal interconnect. Layer 72 may be formed from any suitable insulating material such as phosphosilicate glass (PSG), chemical vapor deposition (CVD) oxide, or other insulating dielectric films.

The details of the construction of transistor 26 that are shown in FIG. 3 are merely illustrative. Any suitable materials system and layer structure may be used for transistor 26 if desired. For example, transistor 26 may be a PMOS transistor. As another example, the resistors R1, R2, and R3 can be formed from diffusions in a suitable silicon region.

The p-type silicon substrate (well region) 66 lies between the source and drain and is normally not conducting due to the two back-to-back diodes formed by the n+/p/n+ structure of the transistor 26. Before programming, the gate G is at ground, which turns the transistor 26 (T1) off. Because the transistor 26 is not conducting and because the gate oxide is intact, the resistance of transistor 26 between terminals A1 and B1 in its unprogrammed state is high. The resistance of transistor 26 may, for example, be about 100 MΩ to over 1 GΩ. The transistor T2 of FIG. 2 is also off when no programming is taking place. The output of the circuit 24 of FIG. 2 in this situation is high (i.e., $V_{OUT} \approx Vcc$).

When it is desired to program antifuse transistor 26, a programming voltage may be applied to the drain terminal D (antifuse terminal A1) of the antifuse transistor 26. For example, logic-level control signals (e.g., a 10 ms positive voltage pulse) may be applied to control circuit 48 of FIG. 2 via terminal 46. The control circuit 48 of FIG. 2 may generate a corresponding control signal $V_{CS}$ at its output, which turns on pass transistor 42 and allows a programming signal pulse Vp of magnitude Vpp or Vpp minus the threshold voltage $V_T$ of the transistor T2 to reach drain terminal D of transistor 26.

Taking the drain voltage to the programming voltage (Vpp or Vpp minus $V_T$) produces a reverse bias in the drain-substrate junction of transistor 26, because the substrate voltage $V_{SUB}$ is initially grounded at $V_{SS}$ through resistor $R_2$. This reverse bias increases the size of the depletion region at the drain-substrate junction and increases the electric field 76 in the vicinity of the depletion region. The depletion region boundary for the drain-substrate junction is shown by dotted line 74 in FIG. 3.

The magnitude of the programming voltage may be significantly higher than the voltage $V_{CC}$ normally used to operate the transistors on circuit 10. As a result, the reverse-biased diode formed at the drain-substrate junction starts to experience avalanche breakdown. The reverse bias avalanche current is shown as current $I_{AVAL}$ in FIG. 3.

During avalanche breakdown, electron-hole pairs are created at the drain-substrate p-n junction and the current $I_{AVAL}$ flows from the transistor's drain region 56 to the transistor's substrate region 66. The substrate is electrically connected to ground through p+ tap region 68 and resistor 32 (R2), so the avalanche current produces a voltage drop across resistor R2 equal to the avalanche current $I_{AVAL}$ times the resistance R2.

The depletion region's electric field E accelerates electrons 78 towards region 56 and holes 80 towards the substrate region 66 and source 58. As these carriers travel through the transistor, additional carriers are freed by the avalanche breakdown effect. In addition, the voltage drop across R2 causes the substrate voltage $V_{SUB}$ to rise. As the substrate voltage $V_{SUB}$ reaches about 0.7 to 1 V, the substrate-source p-n junction becomes forward biased. This, in turn, injects large numbers of carriers 82 into the substrate, as shown in FIG. 3.

Figure 4:
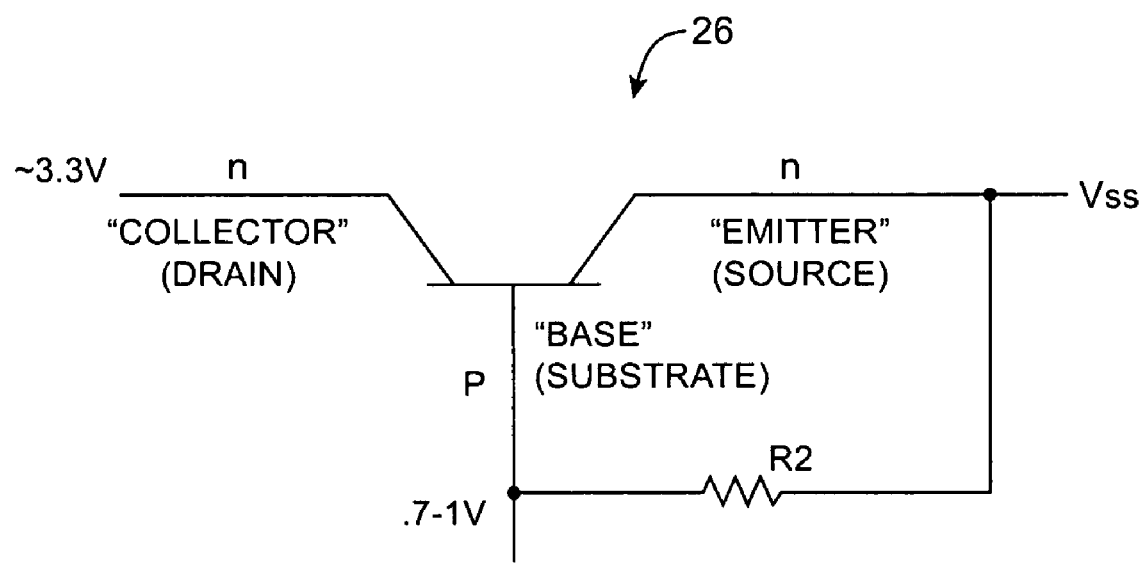
FIG. 4 is a circuit diagram showing the parasitic bipolar transistor formed by an illustrative metal-oxide-semiconductor antifuse transistor in accordance with the present invention.

The injected carriers 82 diffuse to the avalanche-breakdown region at the drain-substrate junction and are accelerated by the electric field at the junction. The additional injected carriers from the forward-biased substrate-source p-n junction contribute to the avalanche breakdown of the drain-substrate p-n junction and serve as a source of positive feedback. In effect, the source, substrate, and drain of the transistor act as the emitter, base, and collector of a parasitic bipolar transistor, as shown in FIG. 4. During programming of transistor 26, carriers injected into the substrate (base) from the source-substrate junction serve to turn the transistor on. As the process progresses, the drain-substrate avalanche current $I_{AVAL}$ produces a significant localized concentration of hot carriers (holes) in the vicinity the drain region 56. These hot carriers cause the adjacent gate oxide to break down, thereby programming the antifuse.

Figure 5A:
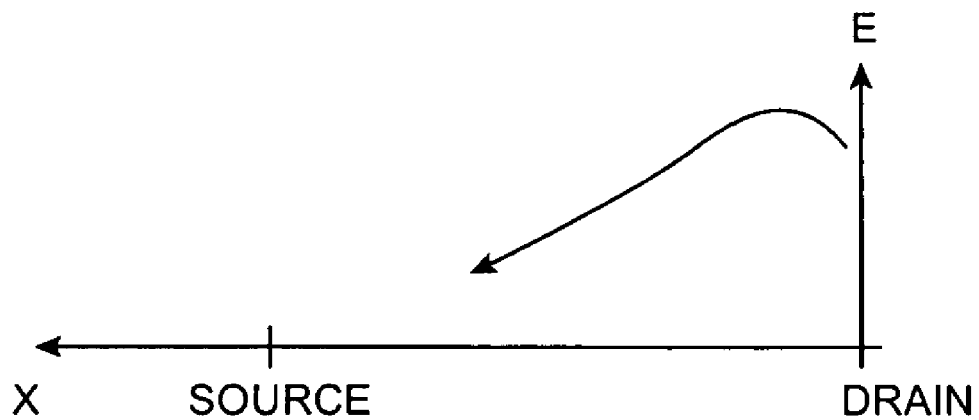
FIG. 5a is a graph showing how the electric field at the gate oxide of a metal-oxide-semiconductor transistor antifuse is greater at one end of the gate than at the other during antifuse programming in accordance with the present invention.
Figure 5B:
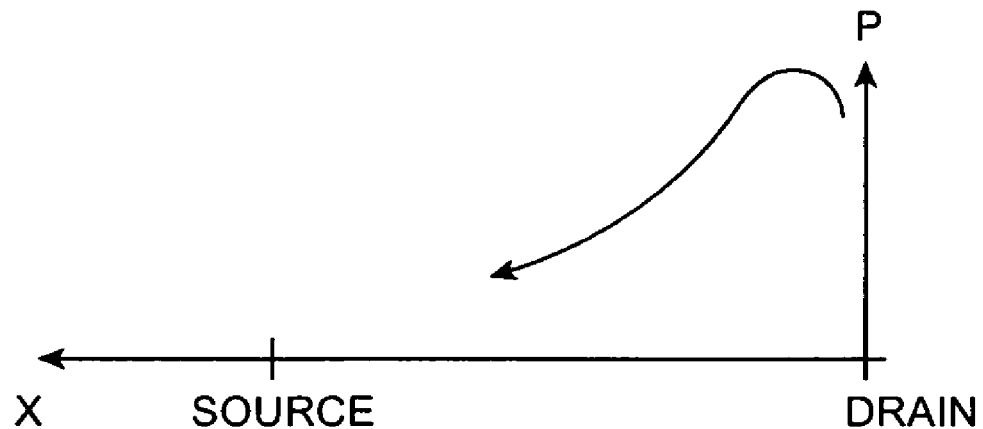
FIG. 5b is a graph showing how the hot carrier concentration underneath the gate oxide is asymmetrically distributed during device programming in accordance with the present invention.

The magnitude of the electric field through the gate oxide and the concentration of hot holes that are produced along the channel length in direction x during antifuse programming are shown in FIGS. 5a and 5b. As shown in these FIGS., the gate oxide is stressed significantly more in the vicinity of the drain than in the vicinity of the source. The asymmetry of the stress concentrates the impact of the programming operation, which tends to lessen the overall effort required to program transistor 26. The transistor 26 can generally be programmed at powers of less than about 150 μW.

During programming, the series resistor R3 (resistor 28 of FIG. 2) may serve as a current-limiting resistor to prevent the programming current $I_{AVAL}$ from becoming too large and melting the silicon in the vicinity of the drain.

Figure 6A:
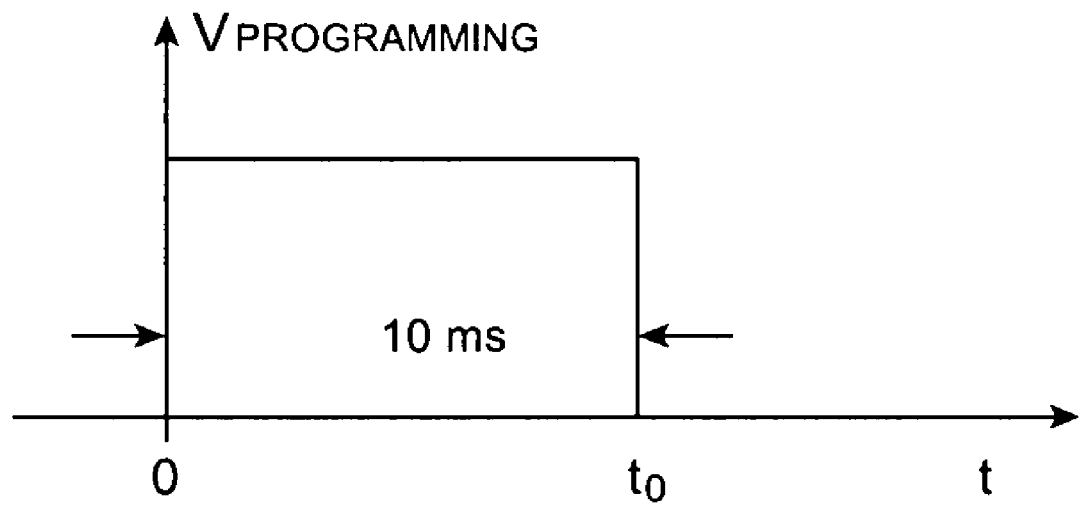
FIG. 6a is a graph of an illustrative programming signal that may be used to program an antifuse transistor in accordance with the present invention.

The time required to program antifuse transistor 26 is typically less than 10 milliseconds. With one suitable approach, each antifuse is programmed using a programming pulse of a fixed known duration (e.g., a pulse with a fixed duration of 10 ms, as shown in FIG. 6a). The transistor 26 will be programmed, and the output voltage $V_{OUT}$ will be caused to drop to a low value in less than 10 ms, as shown in FIG. 6b.

Figure 6B:
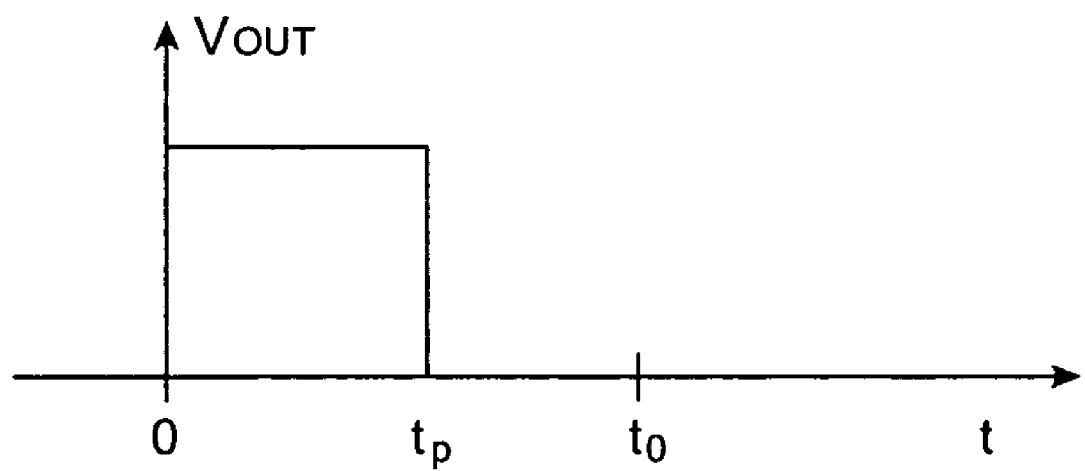
FIG. 6b is a graph of the output voltage of an illustrative antifuse transistor circuit during programming in accordance with the present invention.

Another suitable approach involves monitoring the status of transistor 26 to detect the high-to-low transition of FIG. 6b during programming, so that the programming voltage may be reduced as soon as programming of the transistor 26 is complete. This approach can reduce the power dissipated during the programming process.

One way in which to monitor the status of transistor 26 is to use a feedback path such as path 84 of FIG. 2 to monitor the output voltage of the sensing circuit. The control circuit 48 may monitor the output voltage $V_{OUT}$ using feedback path 84. As soon as the transistor 26 is programmed at time $t_P$, the resistance of the antifuse structure drops and the voltage $V_{OUT}$ drops as shown in FIG. 6b. The control circuit 48 may detect this drop and (after a small circuit delay time) may immediately reduce the programming voltage signal from the programming voltage (e.g., Vpp) to a low voltage (e.g., $V_{SS}$). Because the programming voltage is taken low as soon as successful programming of transistor 26 is detected, this approach reduces power dissipation through the sensing circuit after the antifuse's state has been set.

It is desirable to reduce programming times and/or voltages as much as possible. Shorter programming times increase throughput. Smaller programming voltages make it possible to program antifuses using readily available sources of power. For example, smaller programming voltages may make it possible to perform programming operations using the elevated I/O voltage of about 3.3 volts that is already present on many integrated circuits operating at core Vcc voltages of about 1.2 volts.

The use of the parasitic bipolar transistor behavior of the antifuse MOS transistor structure 26 to create hot carriers (holes in the NMOS example described in connection with FIG. 2) during programming helps to make the programming process more efficient. During programming, the increase in the substrate voltage due to the voltage drop that develops across resistor R2 forward biases of the substrate-source junction and serves to inject carriers (electrons in the NMOS example described in connection with FIG. 2) into the "base" (substrate) of the parasitic bipolar transistor. These injected carriers contribute to more impact ionization, which increases the avalanche current $I_{AVAL}$ at the drain-substrate junction. The increased avalanche current $I_{AVAL}$ increases the current through resistor R2, which serves to forward bias the substrate-source junction even more. The positive feedback loop that is produced with this arrangement helps to ensure that the parasitic bipolar transistor in antifuse 26 is turned on strongly during programming to create a significant concentration of hot carriers at the gate oxide in the vicinity of the drain.

To enhance the feedback behavior of the antifuse transistor programming circuit, the value of resistor R2 can be increased. For a given value of $I_{AVAL}$, a larger value of R2 will produce a correspondingly larger rise in the forward bias on the substrate-source junction, which will in turn inject more carriers into the transistor and turn it on more strongly. However, resistor R2 should not be made too large, because if R2 is too large the transistor 26 will have a poor (low) value of "off resistance."

When transistor 26 is unprogrammed, its gate oxide is intact. During sensing, the transistor 26 is off. The off resistance between terminal A1 and B1 (FIG. 2) should generally be high, so that the ratio of off resistance to on resistance is high. A high off/on resistance ratio is desirable for reliable programming and good sensing performance.

Even when transistor 26 is off, a leakage current flows through resistor R2. If R2 is too high, this small leakage current will produce a non-negligible voltage drop across R2. This will start to forward bias the substrate-source junction and turn the antifuse transistor 26 on, thereby lowering its "off" resistance. Accordingly, the size of R2 and the leakage current associated with transistor 26 should be selected such that unprogrammed antifuse transistors are maintained sufficiently "off" during sensing.

There are several arrangements that may be used to enhance feedback and facilitate programming without producing undesirably large values of leakage current through the transistor during sensing.

Figure 7:
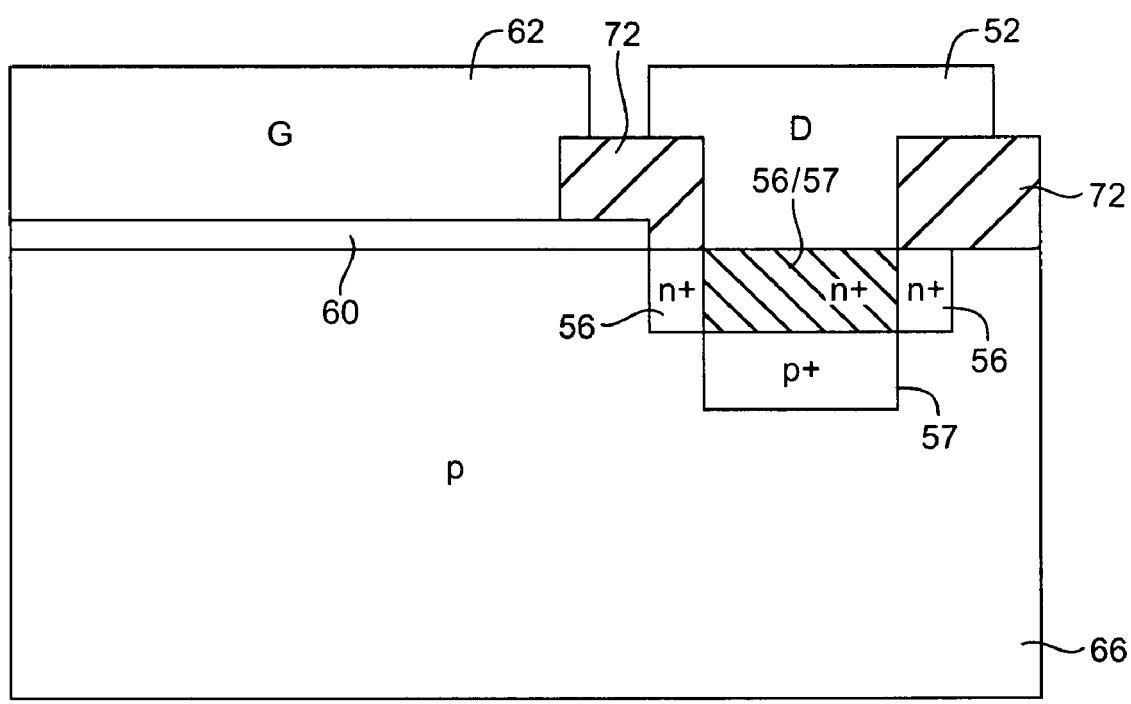
FIG. 7 is a cross-sectional side view of a portion of an illustrative transistor antifuse showing how certain doping regions may be used to enhance antifuse programming in accordance with the present invention.

With one suitable feedback enhancement arrangement, an additional doping region is formed adjacent to the drain. This type of configuration is shown in FIG. 7. In the example of FIG. 7, a p+ doping region 57 has been formed adjacent to the n+ doping region 56. The p+ doping region may be formed, for example, by a diffusion or implantation of p+ dopant at a concentration level that is less than the n+ doping concentration level in region 56. As a result, the semiconductor in hatched overlap region 56/57 will be n-type.

As an example, region 56 may have an n-type doping concentration on the order of $10^{19}$ cm$^{-3}$, region 57 may have a doping concentration of about $10^{18}$ cm$^{-3}$, and region 66 may have a doping concentration of about $10^{17}$ cm$^{-3}$. In overlap region 56/57, the higher doping concentration of the n-type dopant makes the semiconductor in region 56/57 n-type at $10^{19}$ cm$^{-3}$. These concentrations are merely illustrative, any suitable doping concentrations may be used if desired.

The two different p+ doping concentrations (the $10^{18}$ cm$^{-3}$ concentration used for region 57 and the $10^{17}$ cm$^{-3}$ concentration used for region 66) create two parallel p-n junctions with the n-type drain region 56. These two parallel p-n junctions experience avalanche breakdown at different reverse-bias voltage levels. The p-n junction formed from the less heavily doped p-type region 66 and n+ drain region 56 will experience avalanche breakdown at approximately the same voltage levels experienced using the arrangement of FIG. 3. The p-n junction formed from the more heavily doped p-type region 57 and the n+ drain region 56 will break down at a lower voltage (e.g., a voltage as low as 1-2 volts).

By selecting a doping concentration for region 57 that is sufficiently high, the voltage needed to initiate avalanche breakdown of the drain-substrate junction can be lowered. Once there is breakdown at this junction, the voltage across R2 will start to rise and the substrate-source junction will start to become forward-biased. The extra p+ doping region 57 therefore enhances feedback during programming and makes programming more efficient. The size of the heavily-doped junction region 57 may be selected so that this lowered breakdown voltage can be achieved without producing excessive leakage current when the antifuse is in its unprogrammed state.

Figure 8:
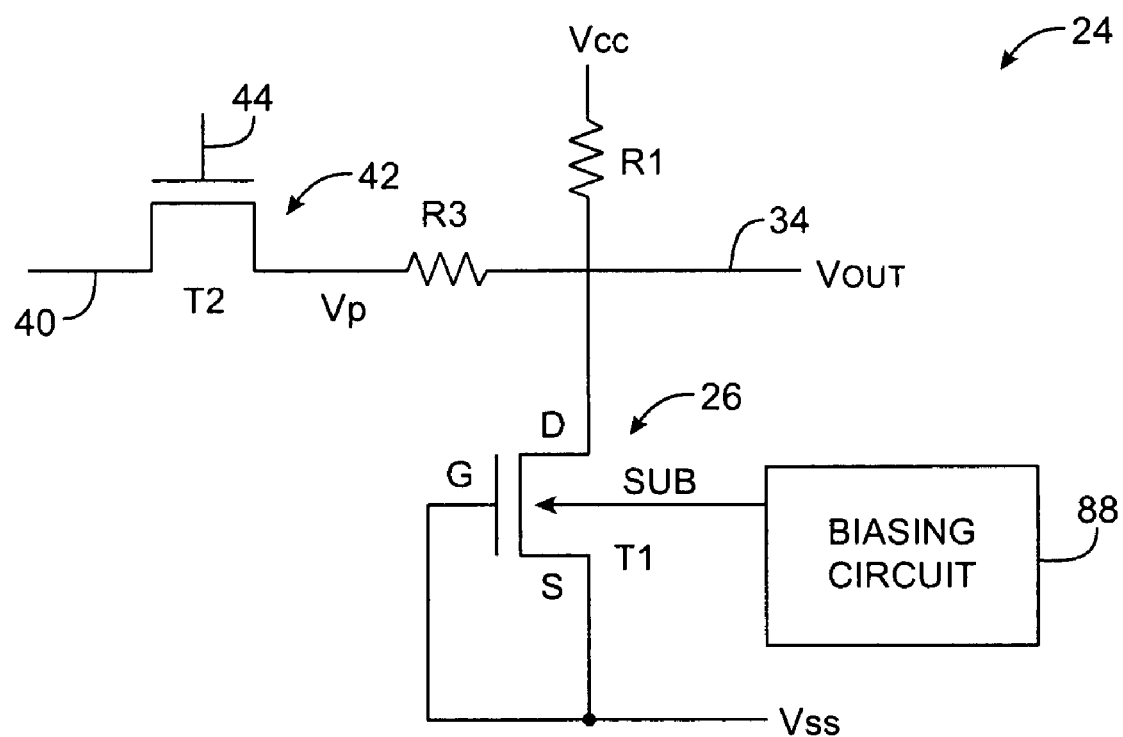
FIG. 8 is a circuit diagram showing how programming circuitry may include a biasing circuit to help program the antifuse transistor in accordance with the present invention.

Another suitable arrangement for enhancing feedback to facilitate programming involves the use of an external biasing circuit. This type of arrangement is shown in FIG. 8. Biasing circuit 88 can be used to apply a biasing signal to the SUB terminal of transistor 26 during programming. The biasing signal can further forward bias the substrate-source p-n junction, thereby injecting more carriers into the base of the parasitic bipolar transistor in the antifuse to turn it on. In the example of FIG. 2, resistor R2 forms a type of biasing circuit. When the current $I_{AVAL}$ flows through R2, a positive voltage is produced at the SUB terminal, which forward biases the substrate-source p-n junction.

Figure 9:
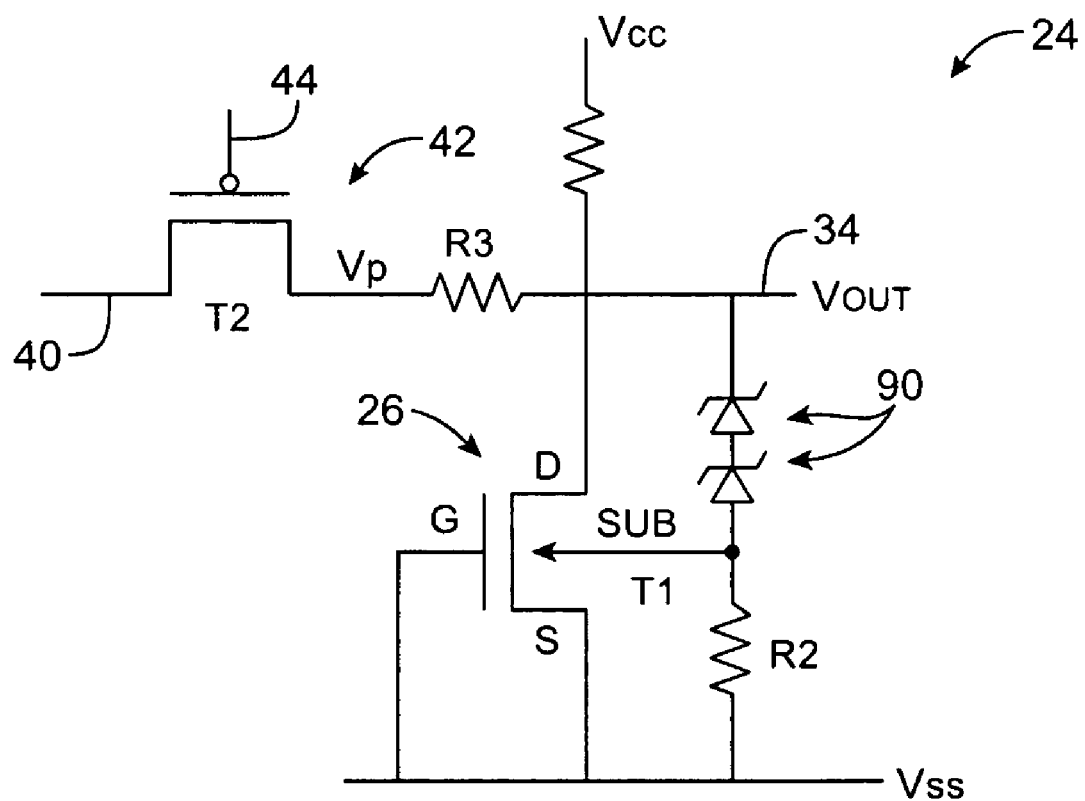
FIG. 9 is a circuit diagram showing how a biasing circuit of the type shown in FIG. 8 may be implemented using Zener diodes in accordance with the present invention.

Another suitable bias circuit arrangement is shown in FIG. 9. In the example of FIG. 9, antifuse circuit 24 has two Zener diodes 90 between output terminal 34 and the SUB terminal of the antifuse transistor 26. During programming, the Zener diodes experience reverse breakdown at a relatively low voltage (about 1 volt). As a result, only a few volts need to be applied to terminal 34 to start a current flowing through resistor R2. As soon as this current starts to flow, the voltage across resistor R2 rises, thereby increasing the bias voltage applied to the SUB terminal to forward bias the substrate-source junction.

Zener diodes 90 experience Zener breakdown at about one volt of reverse bias, so that when the two Zener diodes 90 are placed in series as shown in FIG. 9, they break down at about 2 volts of reverse bias voltage. Because a two-volt breakdown voltage is relatively low, the programming voltage that is used to program antifuse transistor 26 may be lower than with other approaches.

Although other numbers of Zener diodes could be used (e.g., one or three or more), two Zener diodes are generally preferred. Using only one Zener diode might produce more leakage current than desired during sensing (for unprogrammed devices), which would increase power dissipation. If three Zener diodes were to be used, the required programming voltage might be higher than desired.

With the two-Zener-diode arrangement of FIG. 9, there is enough current produced through the transistor 26 to make the substrate voltage $V_{SUB}$ about 0.7-1 volt to forward bias the substrate-source junction and cause a high current to flow through the transistor 26.

Many modern integrated circuits use a low voltage level (e.g., 1.2 volts) to operate their "core" circuitry. Circuitry near the periphery of the integrated circuit (e.g., I/O circuitry) is used to interface with off-chip circuitry and transmission lines. This peripheral circuitry therefore is generally powered using a higher supply voltage (e.g., 3.3 volts). If desired, this higher (e.g., 3.3 volt) I/O power supply voltage may be made available to the pass transistor 42, so that (in response to the control signals applied to its gate 44), the output of transistor 42 will provide a programming signal Vp that ranges from $V_{SS}$ to a voltage of about 3.3 volts.

With this approach, it is not necessary to provide additional charge pump circuitry on circuit 10 to raise the programming voltage (although a charge pump may be used if desired to provide a higher programming voltage). Moreover, special external voltage sources and special high-voltage routing circuitry on circuit 10 need not be provided. Rather, the I/O power supply voltage that is already available for use in operating the I/O circuitry during normal operation can be reused for antifuse programming.

As shown in FIG. 9, transistor T2 may be a PMOS transistor. With this arrangement, the magnitude of Vp is equal to the magnitude of the power supply voltage applied to terminal 40 when the control signals at gate 44 are at ground. During sensing, the control signal on gate 44 may be taken to 3.3 volts (e.g., the I/O power supply voltage) to turn off transistor T2. An NMOS transistor may be used for transistor T2 if desired, although this will lead to a Vp that is less than the power supply voltage at terminal 40 unless the control signal on gate 44 is made larger than Vp. The power supply voltage on line 40 (from the I/O power supply, from a charge pump or from another suitable source) can generally be lower if a p-type pass gate transistor T2 is used.

Figure 10:
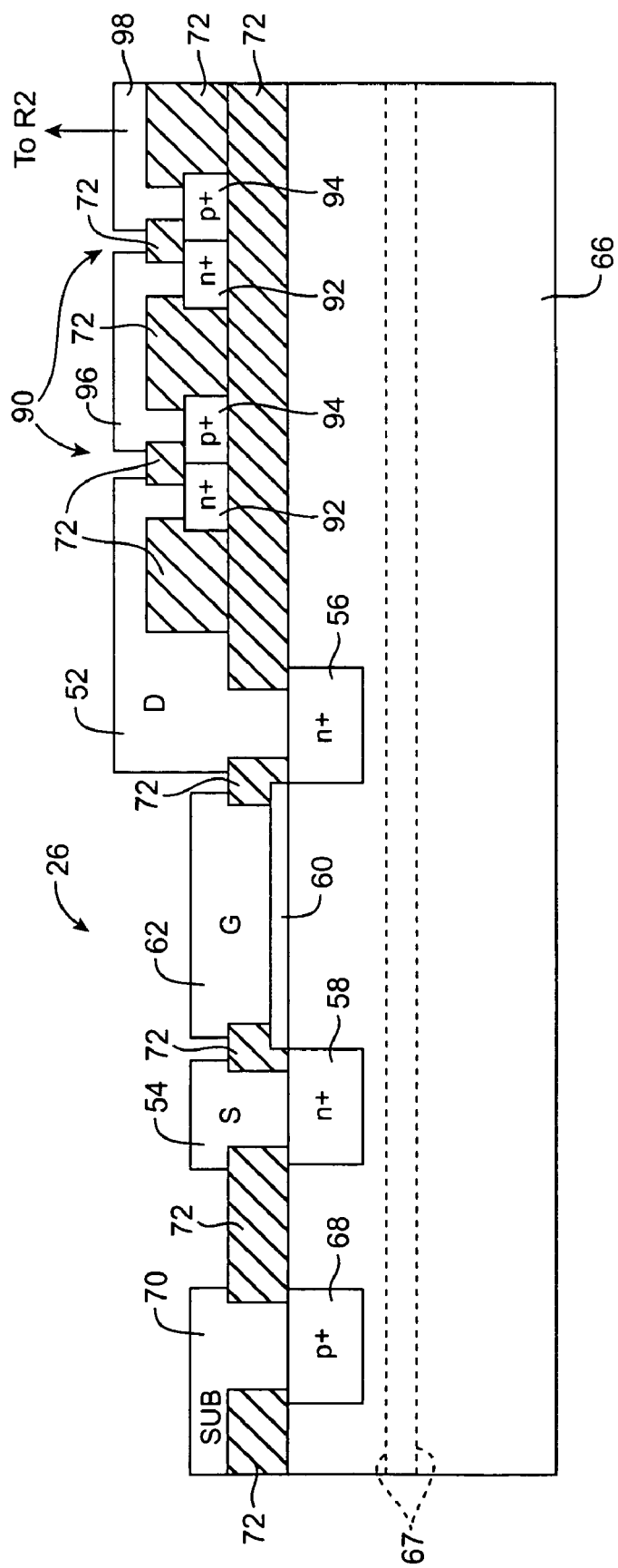
FIG. 10 is a cross-sectional side view of an illustrative antifuse transistor and associated Zener diodes in accordance with the present invention.

An illustrative Zener diode structure that may be used for diodes 90 is shown in FIG. 10. The diodes may be formed on silicon substrate 66 over an area of shallow trench isolation (not shown) to electrically isolate the diodes from the underlying silicon. An oxide layer 72 such as a layer of "polydielectric" may be formed on top of the shallow trench isolation region.

The p-n junctions of the Zener diodes may be formed using p+ regions 94 and n+ regions 92 (having doping concentrations of about $10^{19}$ cm$^{-3}$). A conductor 96 (e.g., a metal line) may be used to connect the region 94 of one diode to the region 92 of the other diode, as shown in FIG. 10. Another conductor 98 may be used to connect the Zener diodes to resistor R2. The structure of FIG. 10 is merely illustrative. Any suitable Zener diode device structure may be used if desired.

The substrate 66 that is used to form the electrically-programmable transistor antifuses and biasing circuit may be a bulk silicon substrate or a silicon-on-insulator (SOI) substrate. If substrate 66 is an SOI substrate, an oxide layer is buried beneath the surface of the silicon. The SOI oxide layer may, for example, be located in the substrate 66 where shown by the dotted lines 67 in FIG. 10.

Figure 11:
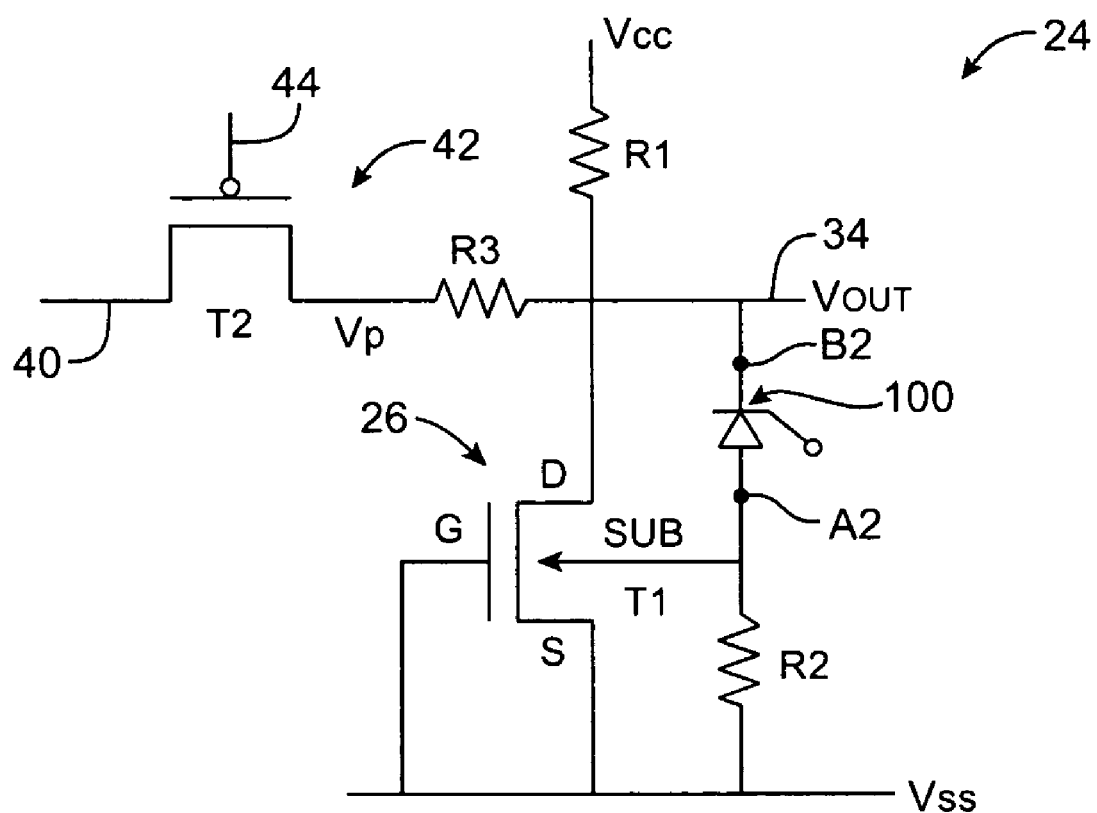
FIG. 11 is a circuit diagram showing how a gated diode may be used in a biasing circuit of the type shown in FIG. 8 in accordance with the present invention.

The biasing circuit 88 of FIG. 8 may be formed using one or more gated diodes. An illustrative antifuse circuit 24 that has a gated diode 100 for biasing the SUB terminal of antifuse transistor 26 is shown in FIG. 11. During normal operation of circuit 24 (i.e., during sensing), the gated diode 100 does not conduct in its reverse direction. As a result, the gated diode has a high resistance. If the antifuse transistor 26 is unprogrammed, the high resistance of the antifuse will cause the output $V_{OUT}$ to go high. If the antifuse transistor 26 is programmed, the low resistance of the antifuse will cause the output $V_{OUT}$ to go low.

When a programming voltage is applied to the antifuse transistor 26 to break down the gate oxide, a positive voltage appears across the gated diode 100 (i.e., the voltage at terminal B2 is greater than the voltage at terminal A2). This reverse biases the gated diode. The reverse-biased gated diode 100 experiences reverse-bias avalanche breakdown. The avalanche breakdown of the gated diode 100 produces an avalanche breakdown current. The avalanche breakdown current of the gated diode 100 flows through resistor R2, raising the voltage at the SUB terminal of antifuse transistor 26. This helps to forward bias the substrate-source p-n junction in the transistor 26 and helps to turn on the transistor 26 at a lower programming voltage than would otherwise be possible.

Figure 12A:
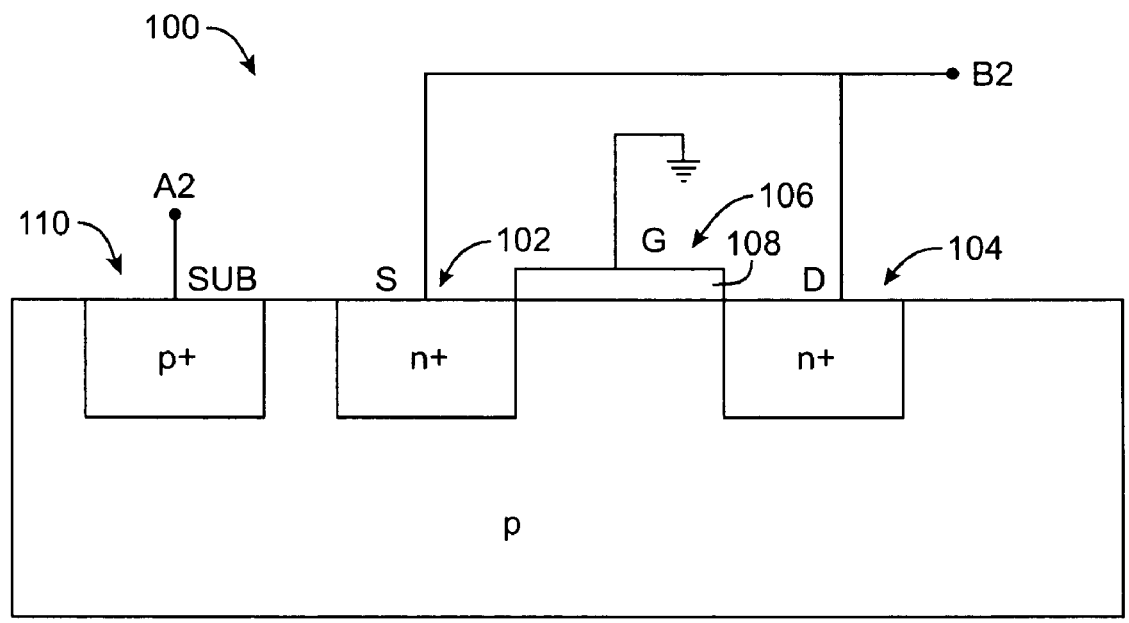
FIG. 12a is a schematic cross-sectional side view of an illustrative gated diode accordance with the present invention.
Figure 12B:
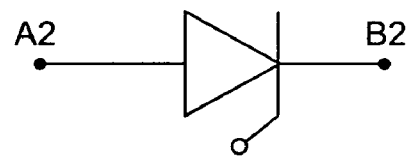

A cross-sectional side view of an illustrative gated diode 100 is shown in FIG. 12a. As shown in FIG. 12a, the diode 100 is formed from a transistor structure having a source 102 and a drain 104. A gate 106 is formed over a gate oxide 108. In the example of FIG. 12a, the gated diode 100 is based on an NMOS structure, so the gate G is grounded. A substrate terminal SUB is connected to the substrate through a substrate tap 110. The gated diode 100 is formed by connecting terminal A2 to the substrate and by connecting the source 102 and the drain 104 together to terminal B2. The corresponding circuit schematic symbol for the gated diode 100 of FIG. 12a is shown in FIG. 12b and in the antifuse circuit 24 of FIG. 11. The circuit of FIG. 11 has a single gated diode. Two or more series-connected gated diodes may be used if desired.

Figure 13:
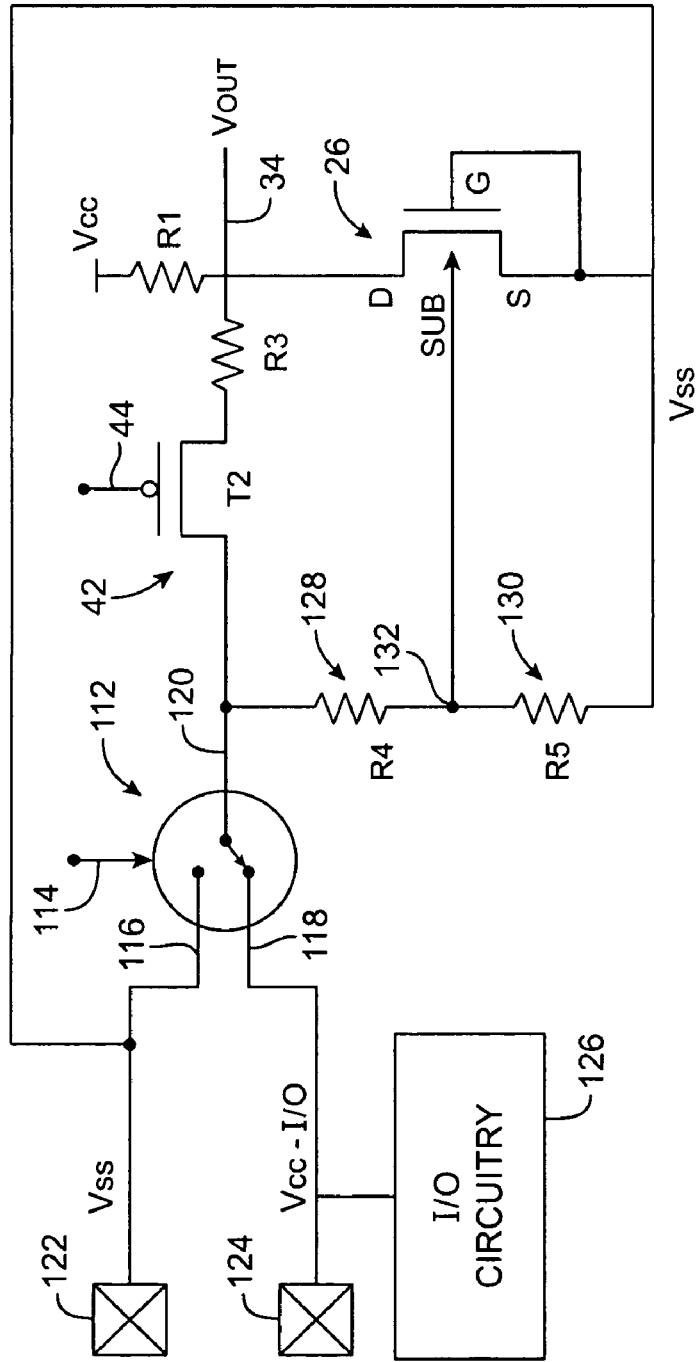
FIG. 13 is a circuit diagram of an illustrative antifuse and programming circuit having biasing circuitry of the type shown in FIG. 8 that is based on a voltage divider in accordance with the present invention.

Another arrangement that may be used for biasing circuit 88 of FIG. 8 is shown in FIG. 13. With the antifuse circuit 24 of FIG. 13, a switch 112 is used to selectively apply a bias voltage to the SUB terminal of the antifuse transistor 26. The switch 112 may be formed from any suitable circuit components such as MOS transistors. Switch 112 may be controlled by control signals applied to terminal 114.

During normal (sensing) operation, a control signal is applied to terminal 114 and the same signal or an associated control signal is applied to terminal 44 of transistor 42. These signals direct switch 112 to connect terminal 116 to terminal 120 and turn transistor 42 off. Terminal 116 is connected to a source of ground potential Vss (e.g., a source of ground potential applied to the circuit 24 from a pin 122). With transistor 42 off and with terminal 120 grounded, the output $V_{OUT}$ at terminal 34 depends on the state of transistor 26. If antifuse transistor 26 is unprogrammed, its resistance will be high and the output $V_{OUT}$ will be high. If antifuse transistor 26 is programmed, its resistance will be low and the output $V_{OUT}$ will be low.

During programming, the control signals at terminals 114 and 44 turn transistor 42 on and direct switch 112 to connect input 118 to output 120. Input 118 may be connected to a source of a suitable programming voltage. The programming voltage may be applied from an external pin such as pin 124. With one suitable arrangement, the voltage supplied to terminal 118 is the same voltage level that is used to power inputoutput circuitry 126 on the integrated circuit 10. With another suitable arrangement, the voltage at terminal 118 is supplied from a charge pump. These are merely illustrative arrangements. Any suitable arrangement may be used to supply the voltage to terminal 118.

Because switch 112 is configured to connect line 118 to line 120 during programming, the programming voltage that is supplied to line 118 is passed to line 120. Transistor 42 is turned on, so this voltage is applied across antifuse transistor 26 to program the antifuse. Biasing of the transistor SUB terminal is accomplished using a voltage divider formed by resistors 128 and 130 (labeled R4 and R5 in FIG. 13).

With this voltage divider, a positive bias voltage is produced at terminal 132 during programming. This voltage raises the voltage of the SUB terminal relative to the source terminal S and forward biases the substrate-source junction. As an example, the voltage divider may raise the voltage of the substrate SUB to about 0.7 to 1 volt above that of the source S. This creates a forward bias at the substrate-source junction that injects carriers into the substrate. The injected carriers help to turn the transistor 26 strongly on, thereby generating hot carriers at the gate oxide in the vicinity of the drain-substrate p-n junction. The hot carriers break down the gate oxide and program the antifuse. Any values may be used for resistors R4 and R5 that produce a suitable bias voltage at node 132. As an example, R4 may have a resistance of about 20 kΩ and R5 may have a resistance of about 10 kΩ.

Figure 14A:
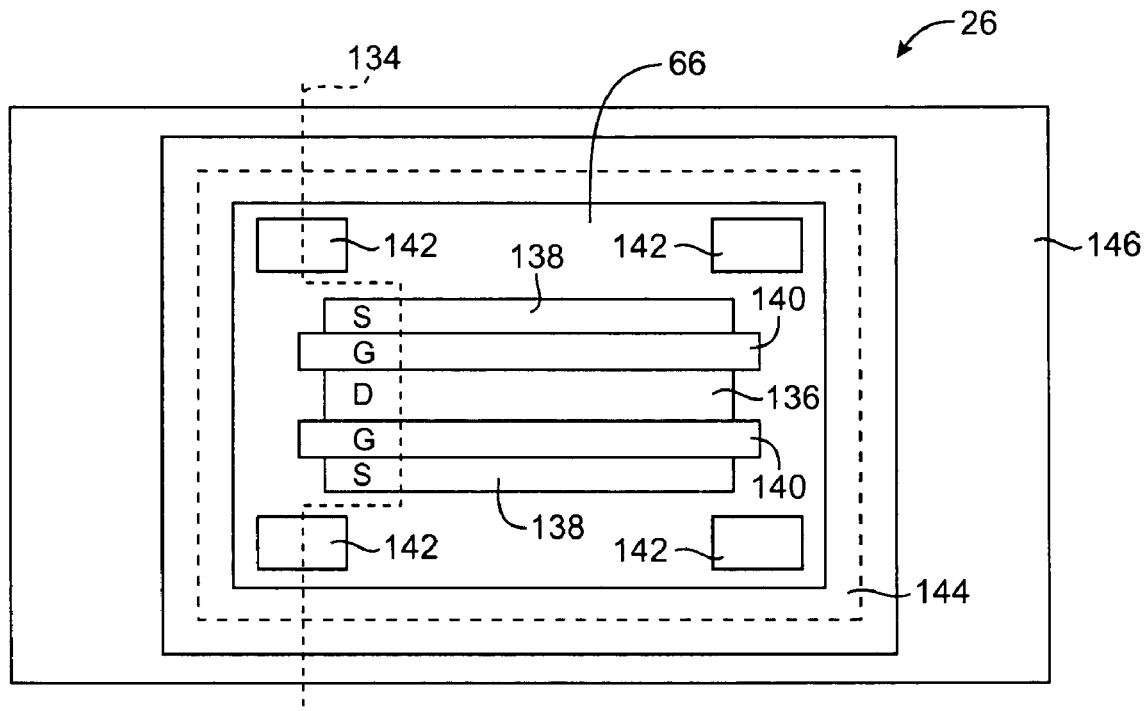
FIG. 14a is a top view of an illustrative device layout that may be used when fabricating an antifuse transistor in accordance with the present invention.
Figure 14B:
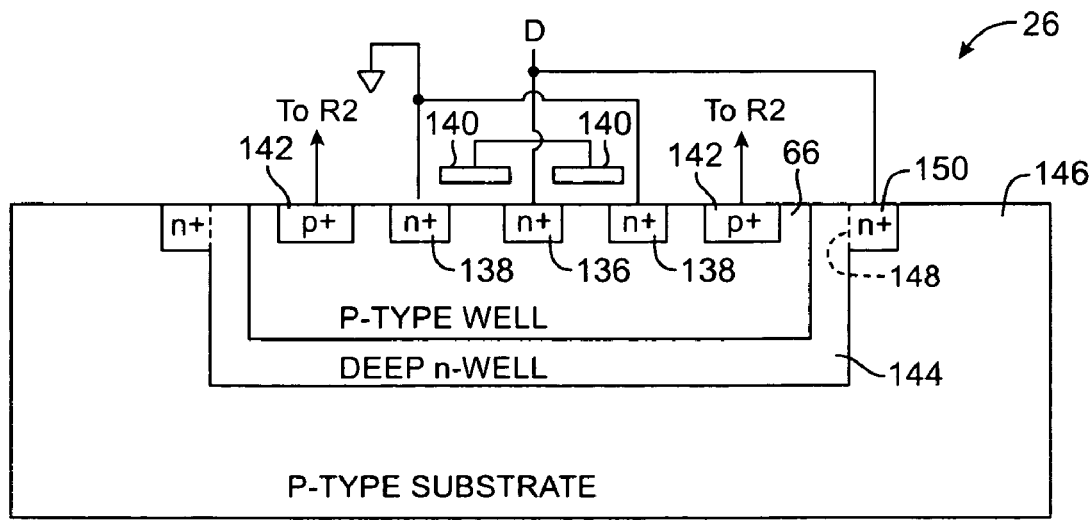
FIG. 14b is a cross-sectional side view of a transistor using a layout of the type shown in FIG. 14a in accordance with the present invention.

Any suitable layout may be used for the antifuse transistors in integrated circuit 10. An illustrative layout that may be used for an antifuse transistor 26 is shown in FIGS. 14a and 14b. The layout shown in FIG. 14a is a top view of the transistor 26. The view of FIG. 14b is a cross-sectional side view of the FIG. 14a structure taken along the dotted line 134 of FIG. 14a.

As shown in FIGS. 14a and 14b, transistor 26 may have a single central n+ drain region 136. Two n+ regions 138 on either side of the drain region may be used to form the source. Two n+ polysilicon regions 140 may be used to form the gate of the transistor. The regions 140 may be silicided. The source and gate regions may be interconnected with each other and with $V_{SS}$ using a layer of patterned conductor such as a layer of silicided doped polysilicon or a layer of metal (not shown in FIGS. 14a and 14b). P+ tap regions 142 may be used to provide an ohmic contact to the p+ substrate/well region 66. The widths of the source, drain, and gate regions may be about 1-5 microns or other suitable widths.

The lengths of the gate regions may be about 0.2 microns or any other suitable lengths. With one suitable approach, the gate length used for antifuse transistor 26 is larger than the minimum channel length permitted by the semiconductor manufacturing process that is used to fabricate integrated circuit 10. By making the gate lengths slightly longer than the minimum size allowed by the semiconductor manufacturing process design rules (e.g., by making the gate 0.2 microns long when the minimum gate length allowed by a design rule is 0.12 microns or less), the drain-to-source leakage current of the antifuse transistor 26 when the transistor is in an off condition can be minimized.

To program the antifuse, the voltage of the substrate $V_{SUB}$ should generally be raised to about 0.7-1.0 volts above the source to forward bias the substrate-source junction. When the entire substrate of the integrated circuit is electrically interconnected, capacitive loading effects tend to resist efforts to raise the substrate voltage V. Accordingly, a deep n-well isolation region 144 may be used to electrically isolate p-type region 66 from the rest of p-type substrate 146. As shown by dotted line 148 and n-well doping region 150, the n-type doping of the deep n-well isolation region may be extended along the surface of the structure to widen the area of isolation.

When an n-well arrangement of the type shown in FIGS. 14a and 14b is used to define a p-type substrate well portion 66, the amount of p-type substrate that needs to be brought up to the voltage 0.7-1.0 volts during programming is significantly reduced. This lowers capacitive loading and makes programming of the antifuse more rapid. In addition, the deep n-well can be electrically connected to the drain n+ region as shown in FIG. 14b. When the drain voltage ramps up during programming, it is capacitively coupled to the isolated p-substrate region 66 through the capacitance of the junction between the deep n-well 144 and the isolated p-substrate. This coupling helps raise the potential of the isolated p-substrate 66, which can reduce the programming voltage required for effective programming.

The behavior of avalanche-breakdown antifuse transistors has been characterized using antifuse transistors of different sizes (without deep n-well isolation region 144).

Transistors with gate widths of 2 microns and gate lengths of 0.24 microns have be observed to have off (unprogrammed) resistances of about 880 MΩ at 25 C, unprogrammed resistances of about 176 MΩ at 85 C, and programmed resistances of less than 1000Ω. The programming current for a 4.5 V programming pulse was observed to be about 25 µA for these transistors.

Transistors with gate widths of 2 microns and gate lengths of 0.5 microns have been observed to have unprogrammed resistances of 1.83 GΩ at 25 C and 366 MΩ at 85 C. Resistances of less than 1000Ω have been observed for these transistors following programming. The programming current for a 4.5 V programming pulse was observed to be about 32 µA for these transistors.

The unprogrammed (off) resistances of these illustrative antifuse transistors is more than five orders of magnitude greater than the programmed resistances of the transistors. This provides good resolution between the high and low states at the output $V_{OUT}$. The wide range between the programmed and unprogrammed resistance values also provides a large design window for the series resistor R1. As power supply voltages scale with future improvements with process technology, the change in the unprogrammed resistance should not be large. In addition, the width of the antifuse transistor may be scaled down to maintain large enough unprogrammed resistances. Further improvements in antifuse performance (e.g., reduced programming voltage) may be obtained by using the deep n-well isolation region 140. The voltages required for avalanche breakdown should become lower as junction depths shrink and become more abrupt due to enhancements in process technology.

Suitable programming powers for the illustrative antifuses have been observed to be lower than 150 µW. Further reductions in the antifuse transistor dimensions may result in lower programming powers.

The programming time may be 10 ms or less. This short programming time allows many antifuses to be programmed in a relatively short time. Moreover, multiple antifuses may be programmed in parallel to further reduce the total programming time for the programming operation.

The behavior of an antifuse circuit arrangement having a bias circuit based on a two-diode Zener-diode stack has also been characterized. Due to leakage current through the Zener diodes, the ratio of antifuse off resistance to on resistance is lower than when no bias circuit is used (i.e., three orders of magnitude rather than five orders of magnitude). Nevertheless, the lower programming voltage that is achieved through the use of the bias circuit may make this bias circuit approach more attractive in certain applications.

Figure 15:
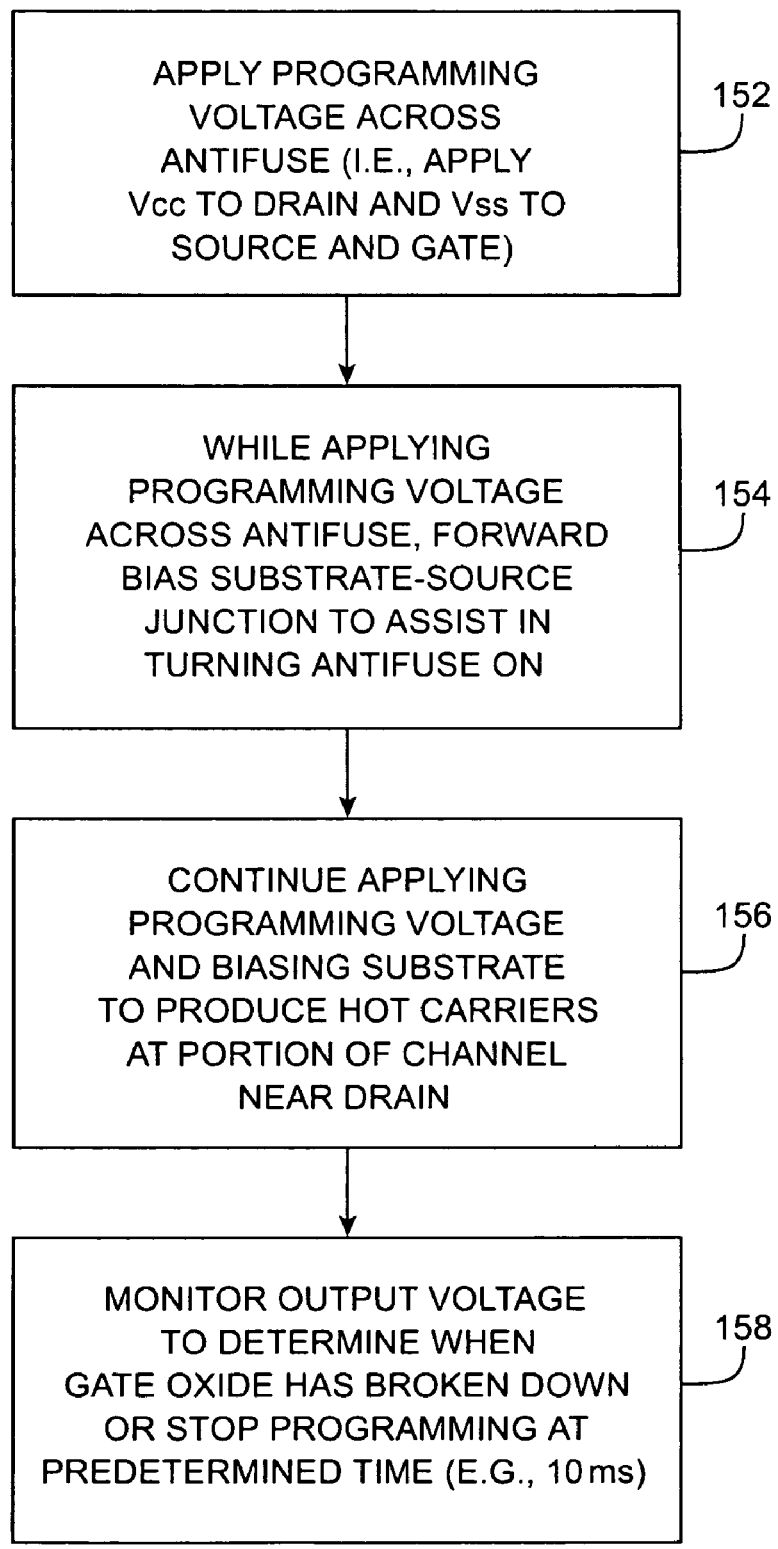
FIG. 15 is a flow chart of illustrative steps involved in programming an antifuse transistor in accordance with the present invention.

A flow chart of illustrative steps involved in programming the antifuse transistor 26 using an antifuse circuit 24 of the type described in connection with FIGS. 1-14 is shown in FIG. 15. At step 152, a programming voltage is applied across the antifuse. For example, in an NMOS-based antifuse arrangement, a positive voltage may be applied to the transistor's drain, while the gate and source of the transistor are grounded. The programming voltage may be generated by a charge pump or other internal circuitry or may be supplied from an external source (e.g., through a pin). With one suitable arrangement, a relatively high voltage such as the I/O power supply voltage that is already available on the integrated circuit for powering input-output circuitry on the integrated circuit may be used as the programming voltage.

Application of the programming voltage at step 152 raises the potential of the drain with respect to the transistor's substrate, thereby reverse biasing the drain-substrate junction and producing a reverse-bias avalanche breakdown current at the drain-substrate junction.

At step 154, while the programming voltage is being applied to the antifuse transistor and while the drain-substrate junction is reverse biased, a voltage can be applied to the transistor's substrate/well region (SUB terminal) to forward bias the substrate-to-source p-n junction. In a NMOS configuration, for example, the source may be grounded. The voltage on the SUB terminal may be raised relative to the grounded source by allowing the drain-substrate avalanche breakdown current to flow through a resistor R2 that is connected between the substrate and ground.

Forward-biasing the substrate-source p-n junction injects carriers into the substrate while the drain-substrate junction is reverse biased due to the application of the programming voltage. The injected carriers help to turn on the antifuse transistor.

Positive feedback can be created during programming. As the forward-biased substrate-source junction injects carriers into the substrate, the injected carriers increase the magnitude of the reverse-bias avalanche breakdown current at the drain-substrate junction. This increase in reverse-bias current leads to more current flowing through the resistor R2. The increase in current flowing through resistor R2 causes a corresponding increase in the voltage drop across the resistor R2, which raises the potential of the substrate with respect to the source. Because this further forward-biases the substrate-source junction, positive feedback is created.

The feedback produced during step 154 may be enhanced using an antifuse transistor structure of the type described in connection with FIG. 7 in which multiple parallel drain-substrate junctions are formed each having a different reverse-bias avalanche breakdown voltage. The feedback of step 154 may also be enhanced by using a suitable external bias circuit 88, as described in connection with the Zener-diode bias circuitry of FIGS. 9 and 10, the gated-diode bias circuitry of FIGS. 11 and 12, and the voltage-divider bias circuitry of FIG. 13.

The circuitry that is used to apply the programming voltage to the antifuse and that is used to apply suitable signals to the substrate terminal of the antifuse is shown as control circuitry 18 in FIG. 1. At step 156, the programming voltage and the substrate bias continue to be applied to the antifuse transistor by control circuitry 18 to produce a sufficient quantity of hot carriers in the vicinity of the drain to break down the gate oxide and program the antifuse.

When a transistor arrangement of the type shown in FIGS. 14a and 14b is used for antifuse transistor 26, the hot carriers are generated at the inner portions of the split gate that are adjacent to the drain. Regardless of the particular geometry that is used for the antifuse, however, hot carrier generation is asymmetric—more hot carriers are generated at one source-drain terminal (e.g., the drain) than are generated at the other source-drain terminal (e.g., the source). As a result, the portion of the gate oxide nearest the drain-source terminal that is injecting the hot carriers into the substrate (e.g., the gate oxide portion in the vicinity of the drain) is exposed to the highest concentration of hot carriers. By stressing the gate oxide asymmetrically—i.e., by forcing the gate oxide to break down in the region in the vicinity of the a particular drain-source terminal rather than uniformly under the entire gate, the efficiency of the programming process is significantly enhanced.

At step 158, the transistor may be monitored to determine whether programming has been completed. For example, a feedback path such as feedback line 84 of FIG. 2 may be used to monitor when the output voltage $V_{OUT}$ changes. When it is determined that the gate oxide has broken down so that the resistance of the antifuse is in its low state, programming can be considered to be complete and the control circuitry 18 can stop applying the programming voltage and substrate voltage to the antifuse transistor. If desired, the control circuitry can apply programming pulses of fixed voltages and duration (e.g., 10 ms). When fixed voltages and durations are used, it is not necessary to monitor the antifuse transistor during programming to determine when programming is complete.

After the antifuse has been programmed using the process of FIG. 15, the sensing circuitry associated with the antifuse may be used to sense its state. There are typically numerous antifuses on a given integrated circuit. The antifuse transistors that have been programmed have low resistances, whereas the antifuse transistors that have not been programmed have high resistances. The sensing circuitry can be used to produce corresponding voltage outputs (e.g., a high voltage signal at an output terminal such as terminal 34 when an antifuse is unprogrammed and has a high resistance or a low voltage signal at an output terminal such as terminal 34 when an antifuse has been programmed and has a low resistance).

Because the antifuses are programmed by breaking down a gate oxide without melting adjacent silicon, it is relatively difficult to use tools such as scanning electron microscopes to detect whether a given antifuse has been programmed. The antifuses may therefore be suitable for high-security applications.

The foregoing is merely illustrative of the principles of this invention and various modifications can be made by those skilled in the art without departing from the scope and spirit of the invention.

What is claimed is:

1. A method of programming an antifuse transistor that is formed from a semiconductor and that has a drain, a source, a substrate that forms a substrate-source p-n junction with the source, and a gate having a gate insulator, comprising:

during programming, injecting hot carriers into the substrate under the gate insulator while forward biasing the substrate-source p-n junction using a biasing circuit that is connected between the source and substrate to break down the gate insulator and program the antifuse transistor, wherein more hot carriers are injected into the substrate at the drain than at the source so that the gate insulator is stressed asymmetrically.

2. The method defined in claim 1, wherein the drain and substrate form a drain-substrate p-n junction in the semiconductor and wherein the biasing circuit includes a resistor, the method further comprising:

flowing current through the resistor to raise the voltage of the substrate relative to the source during programming to forward bias the substrate-source p-n junction.

3. The method defined in claim 1, wherein the drain and substrate form a drain-substrate p-n junction in the semiconductor and wherein the biasing circuit includes a resistor, the method further comprising:

flowing current through the resistor to raise the voltage of the substrate relative to the source to forward bias the substrate-source p-n junction, wherein forward biasing the substrate-source p-n junction injects carriers into the substrate, which increases current flow through the resistor that further raises the voltage of the substrate.

4. The method defined in claim 3, wherein the biasing circuit includes at least one reverse-biased Zener diode and wherein flowing the current through the resistor to raise the voltage of the substrate comprises using the reverse-biased Zener diode in breakdown to help cause current to flow through the resistor.

5. The method defined in claim 3, wherein the biasing circuit includes at least one reverse-biased gated diode and wherein flowing the current through the resistor to raise the voltage of the substrate comprises using the reverse-biased gated diode in breakdown to help cause current to flow through the resistor.

6. The method defined in claim 3, wherein there are at least two regions of the substrate adjacent to the drain that have different doping levels so that there are at least two drain-substrate p-n junctions in parallel each having a different associated reverse-bias breakdown voltage and wherein flowing the current through the resistor to raise the voltage of the substrate comprises using the two parallel p-n junctions to cause current to flow through the resistor to raise the voltage of the substrate.

7. The method defined in claim 1, wherein the drain and substrate form a drain-substrate p-n junction in the semiconductor and wherein the biasing circuit includes a switch and voltage divider circuit, the method further comprising:

using the switch and voltage divider circuit to raise the voltage of the substrate relative to the source during programming to forward bias the substrate-source p-n junction.

8. The method defined in claim 1 wherein the antifuse transistor is formed on an integrated circuit having I/O circuitry powered by an I/O power supply voltage, the method comprising applying a voltage to the drain during programming at the I/O power supply voltage.

9. The method defined in claim 1 wherein the antifuse transistor is formed from a semiconductor and wherein injecting hot carriers into the substrate under the gate insulator to break down the gate insulator comprises injecting hot carriers into the substrate under the gate insulator to break down the gate insulator without melting the semiconductor.

* * * * *